United States Patent [19]

Nishizawa et al.

[11] Patent Number: 5,275,184
[45] Date of Patent: Jan. 4, 1994

[54] APPARATUS AND SYSTEM FOR TREATING SURFACE OF A WAFER BY DIPPING THE SAME IN A TREATMENT SOLUTION AND A GATE DEVICE FOR CHEMICAL AGENT USED IN THE APPARATUS AND THE SYSTEM

[75] Inventors: Hisao Nishizawa; Yoshio Nomura; Hiroyuki Araki, all of Shiga, Japan

[73] Assignee: Dainippon Screen Mfg. Co., Ltd., Kyoto, Japan

[21] Appl. No.: 779,481

[22] Filed: Oct. 18, 1991

[30] Foreign Application Priority Data

Oct. 19, 1990 [JP] Japan .............. 2-109823[U]

[51] Int. Cl.$^5$ .............................................. B08B 3/10
[52] U.S. Cl. ................... 134/57 R; 134/902; 134/155; 134/186; 134/105; 134/102.1
[58] Field of Search ............ 134/76, 79, 105, 186, 134/902, 155, 102.1, 57 R; 134/56 R

[56] References Cited

U.S. PATENT DOCUMENTS

| | | |
|---|---|---|
| 4,633,893 | 1/1987 | McConnell et al. |
| 4,694,527 | 9/1987 | Yoshizawa ............ 134/902 |
| 4,736,758 | 4/1988 | Kusuhara ............ 134/902 X |
| 4,895,604 | 1/1990 | Hayashi . |
| 4,967,777 | 11/1990 | Takayama et al. ............ 134/186 |
| 4,985,722 | 1/1991 | Ushijima et al. ............ 134/79 |
| 5,081,733 | 1/1992 | Kudo ............ 134/902 |

FOREIGN PATENT DOCUMENTS

| | | |
|---|---|---|
| 59-46032 | 3/1984 | Japan . |
| 61-247034 | 11/1986 | Japan ............ 134/902 |
| 61-281532 | 12/1986 | Japan ............ 134/902 |
| 62-26034 | 2/1987 | Japan . |
| 63-164229 | 10/1988 | Japan . |
| 1-255227 | 12/1989 | Japan . |
| 2-47046 | 3/1990 | Japan . |
| 2-76227 | 3/1990 | Japan . |
| 2-159029 | 6/1990 | Japan . |

*Primary Examiner*—Frankie L. Stinson
*Attorney, Agent, or Firm*—Lowe, Price, LeBlanc & Becker

[57] ABSTRACT

A dipping type wafer treatment apparatus includes a treatment solution bath capable of forming a uniform rising flow of a treatment solution inside from an inlet to an outlet, a treatment solution supplying unit for supplying a treatment solution at a constant velocity to the inlet of the treatment solution bath to form a uniform rising flow of the treatment solution inside the treatment solution bath and a device for dipping and retrieving the wafer into and out of the uniform flow of the treatment solution. The treatment solution is supplied from the inlet in the treatment solution bath and drown off through an outlet of the treatment solution bath. Accordingly, the treatment solution can be rapidly substituted, and the wafers to no experience contact with air during replacement of the treatment solutions.

27 Claims, 15 Drawing Sheets

FIG. 1                  PRIOR ART
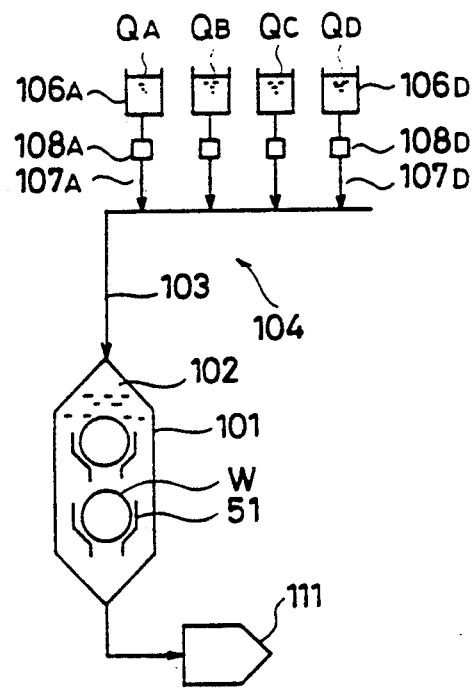
FIG. 1A               PRIOR ART
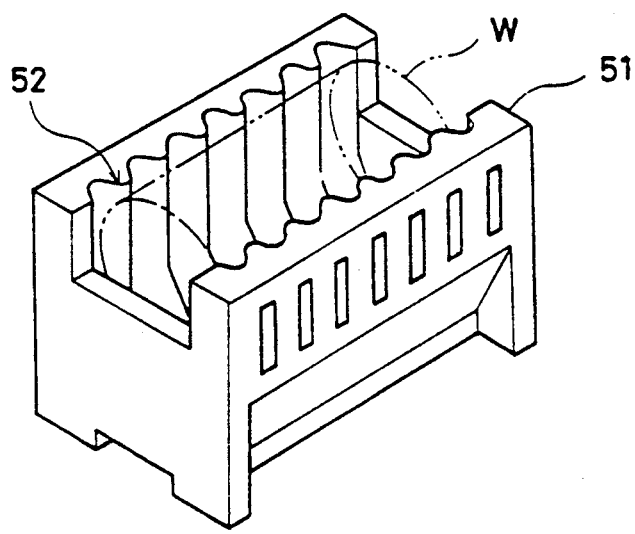

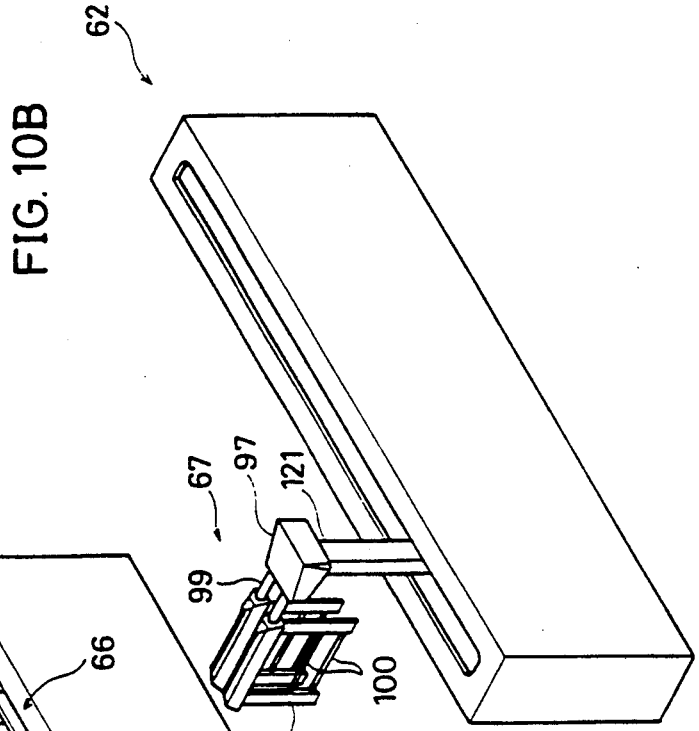
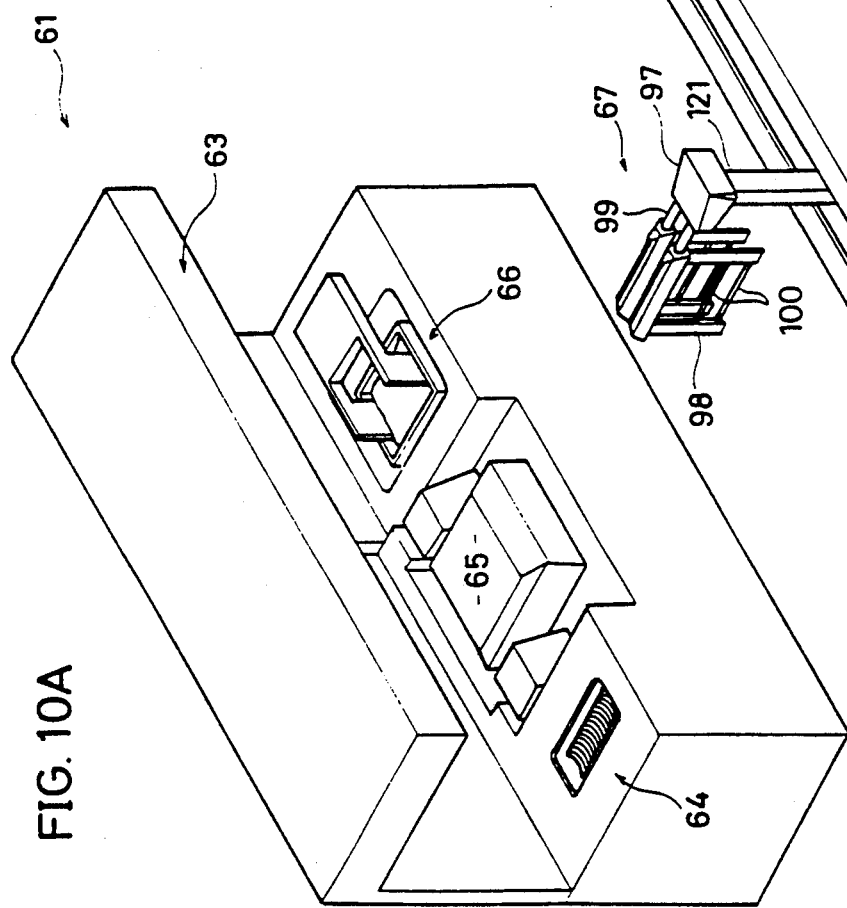
FIG. 10A
FIG. 10B

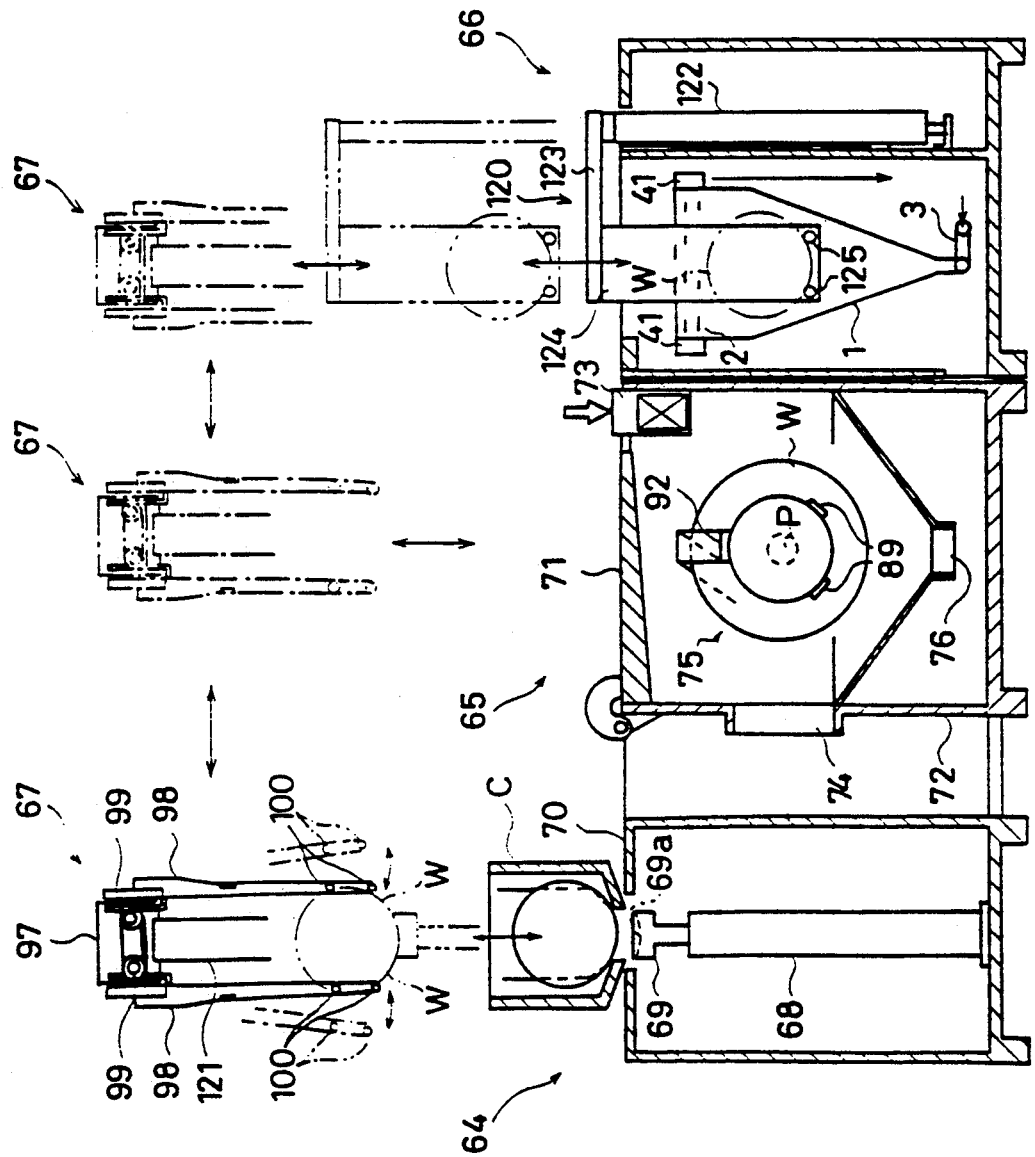

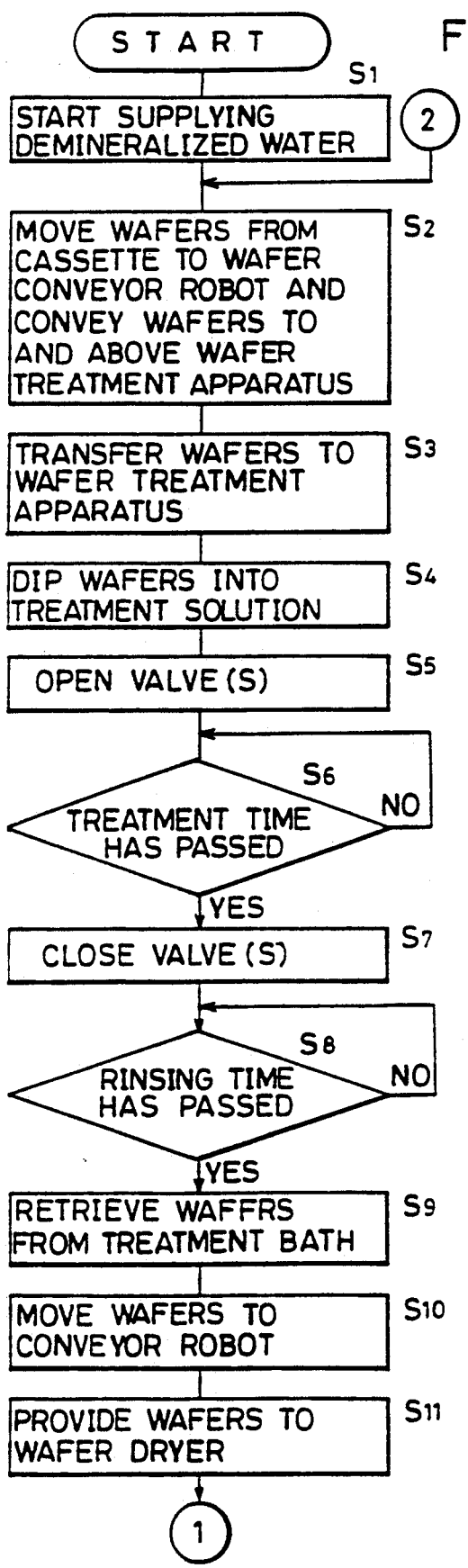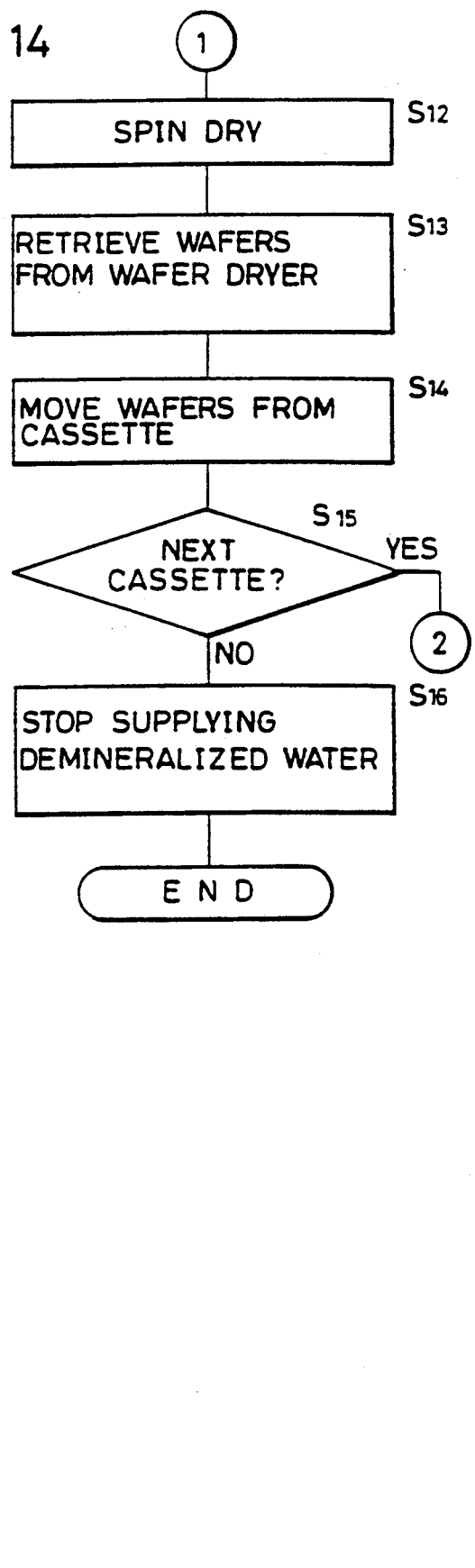
FIG. 14

APPARATUS AND SYSTEM FOR TREATING SURFACE OF A WAFER BY DIPPING THE SAME IN A TREATMENT SOLUTION AND A GATE DEVICE FOR CHEMICAL AGENT USED IN THE APPARATUS AND THE SYSTEM

BACKGROUND OF THE INVENTION

1. Field of the Invention

The present invention relates to apparatus and systems for treating surfaces of laminated semiconductor substrates or liquid crystal glass substrates and the like (hereinafter, simply referred to as a wafer), and particularly to an apparatus and a system for performing surface treatment of wafers in which the wafers are dipped into treatment solution and composition of the treatment solution is changed, and a gate device for chemical agent included in the apparatus and the system.

2. Description of the Related Art

Cleaning of wafers greatly contributes to the improvement of the yield of semiconductor devices, for example, by removing contaminations from the wafers. A conventional technique of this kind is disclosed in Japanese Patent Publication No. 2-13459 (Japanese application No. 60-243025, filed on Oct. 31, 1985, Japanese Patent Laying-Open No. 61-295635, layed open on Dec. 26, 1986, corresponding to U.S. Pat. No. 4,633, 893, U.S. Ser. No. 747894 filed in the United States in Jun. 24, 1985). Referring to FIG. 1, a wafer treatment apparatus described in the document includes a wafer treatment bath 101, and a treatment solution supplying unit 104 for supplying a treatment solution 102 into wafer treatment bath 101.

Treatment solution supplying unit 104 includes a treatment solution drawing line 103 communicating with a treatment solution input port of wafer treatment bath 101, and chemical agent containers 106A–106D communicating with treatment solution drawing line 103 through chemical agent supplying lines 107A–107D and chemical agent introducing valves 108A–108D on the upstream of wafer treatment bath 101 for containing plural kinds of chemical agents $Q_A$ - $Q_D$.

Etching agents such as hot sulfuric acid and hydrogen fluoride, or demineralized water, for example, are contained in chemical agent containers 106A–106D.

Wafer treatment bath 101 can be hermetically closed except for an inlet port and an outlet port for treatment solution. The outlet port communicates with drain 111.

Referring to FIG. 1A, wafers W are loaded in a cassette 51 and carried into wafer treatment bath 101 to be subjected to surface treatment. A space for accommodating a plurality of wafers W is formed inside cassette 51. Groves 52 for holding edges of wafers W are formed on side portions of the space.

The conventional apparatus shown in FIG. 1 operates as follows. Before treatment, cassette 51 in which wafers W are provided is carried into wafer treatment bath 101. Wafer treatment bath 101 is hermetically closed. Selectively controlling respective chemical agent introducing valves 108A–108D to open or close the same, desired chemical agents $Q_A$ - $Q_D$ are introduced into treatment solution drawing line 103. The introduced chemical agents are mixed and flow into wafer treatment bath 101. The surface of wafer W is treated with the flowing treatment solution. The treatment solution flows from the inlet to the outlet of wafer treatment bath 101 and let out into drain 111 from the outlet.

When the position of the treatment solution is to be changed in the course of the treatment, states of chemical agent introducing valves 108A–108D are selectively changed. In this case, the treatment solution in which the composition is changed flows into wafer treatment bath 101 following the treatment solution before the change and smoothly displace the same from wafer treatment bath 101. In the document, it is described that this is because a plug flow of the treatment solution is formed in wafer treatment bath 101.

After finishing the wafer treatment, chemical agent introducing valves 108A–108D are all closed. The treatment bath 101 is emptied. A wafer take-out port not shown provided in treatment bath 101 is opened and cassette 51 is taken out.

According to the conventional apparatus, when treatment solution 102 in treatment bath 101 is to be replaced with another treatment solution, the replacement can be completed in a short time. Accordingly, rapid surface treatment can be performed. Also, in substituting treatment solution 102 in bath 101, it is not necessary to draw all the treatment solution 102 from bath 101. Accordingly, wafers W never touch the air during treatment, so that troubles such as formation of an oxidized film on its surface will not occur.

However, the conventional apparatus still has the following problems to be solved. In this apparatus, quantities of chemical agents introduced into treatment solution 103 may fluctuate according to the fluctuations of the inner pressure in chemical agent containers 106A–106D and quantities of chemical agents remaining inside when introducing chemical agents $Q_A$ - $Q_D$ into treatment solution drawing line 103. Accordingly, demineralized water and chemical agents can not be precisely proportioned so that good surface treatment may not be applied to wafers W.

The conventional apparatus also has other problems to be solved as described below. Wafer treatment bath 101 is hermetically closed during treatment. Accordingly, it is necessary to draw all the treatment solution 102 from treatment bath 101 when loading wafers W into treatment bath 101 before treatment and taking out the same therefrom after the treatment. Furthermore, an outlet port must be provided in wafer treatment bath 101 and a mechanism is required for automatically opening and closing the outlet port when all the treatment solution is drawn out of bath 101. Such a mechanism is so complex that the process of manufacturing the apparatus and the method of operating the same become unnecessarily complex. The time required before and after the treatment also increases and the surface treatment of wafers is not conducted rapidly enough.

Also, the surfaces must be rapidly dried after surface treatment using the conventional apparatus. Accordingly, there has been a great demand for a system capable of integrally performing these works.

SUMMARY OF THE INVENTION

Accordingly, it is an object of the present invention to provide a dipping type wafer treatment apparatus and a system capable of rapid surface treatment of a wafer and a gate device for a chemical agent used in the apparatus and the system.

It is another object of the present invention to provide a dipping type wafer treatment apparatus and a system with a relatively simple mechanism capable of rapid surface treatment of a wafer and a gate device for a chemical agent used in the apparatus and the system.

It is still another object of the present invention to provide a dipping type wafer treatment apparatus and a system with a relatively simple mechanism capable of rapidly substituting treatment solutions during surface treatment of a wafer and a gate device for a chemical agent used in the apparatus and the system.

It is additional object of the present invention to provide a dipping type wafer treatment apparatus and a system capable of rapidly substituting treatment solutions during surface treatment of a wafer and using no hermetically closed type treatment bath and a gate device for chemical agent used in the apparatus and the system.

It is another additional object of the present invention to provide an open-type and dipping-type wafer treatment apparatus and a system capable of rapidly substituting treatment solutions and precisely controlling composition thereof during surface treatment of a wafer and a gate device for a chemical agent used in the apparatus and the system.

It is another object of the present invention to provide a dipping type wafer treatment apparatus and a system using an open-type wafer treatment bath capable of substituting treatment solutions rapidly during treatment keeping the wafer from air and a gate device for a chemical agent used in the apparatus and the system.

An apparatus for treating a wafer surface according to the present invention includes a uniform treatment solution flow container having an inlet and an outlet for a treatment solution provided opposing to each other along a predetermined vertical axis line for containing a uniform flow of the treatment solution substantially parallel with the axis line in a direction from the inlet to the outlet, a treatment solution supplying device for forming a uniform flow of the treatment solution in the container by providing the treatment solution at a velocity parallel with the axis line direction at the inlet of the container, and a wafer dipping/retrieving device for dipping a wafer into the uniform flow of the treatment solution and retrieving the wafer therefrom. The container has a peripheral wall having a vertical axis line. The peripheral wall defines the outlet at its upper portion and the inlet at its lower portion. The peripheral wall defines the interior of the container and separates it from the exterior, thereby allowing the treatment solution to flow out of the container only from the outlet.

A treatment solution provided into a container from an inlet is drawn off from an outlet. Accordingly, when the treatment solution supplied into the container is substituted with another treatment solution during treatment, the old treatment solution inside the container is rapidly displaced by the new treatment solution. Since the treatment solution forms a uniform flow in the container, old treatment solution will never remain in the container so that surface treatment can be well carried out. Since a wafer can be treated with treatment solutions of different kinds continuously, rapid surface treatment of a wafer can be implemented. Since the wafer does not come in contact with the air when the treatment solution is replaced, the wafer surface will not be contaminated by fine particles and the like in the air.

According to another aspect of the present invention, a system for treating surfaces of a plurality of wafers loaded in a cassette includes a cassette loader for unloading/loading the wafers from/into the cassette, a wafer conveyer robot for conveying the wafers unloaded from the cassette by the cassette loader along a predetermined conveyer path, a treatment solution flow container provided along the conveyer path of the wafer having an inlet and an outlet of a treatment solution opposingly provided along a predetermined axis line for containing a uniform flow of the treatment solution substantially parallel with the axis line direction from the inlet to the outlet, a uniform treatment solution flow forming device for forming a uniform flow of a treatment solution inside the container by providing a treatment solution to the container at a velocity parallel with the axis line direction at the inlet, a wafer dipping/retrieving device provided along the conveyer path and adjacent to the container for giving and receiving a wafer to/from the wafer conveyer robot and dipping/retrieving the wafer in and from the uniform flow of the treatment solution, and a wafer drying device provided along the conveyer path for further drying the wafer treated in the container.

According to the system of the present invention, a plurality of wafers loaded in a cassette are unloaded by the cassette loader and given to the wafer conveyer robot. The wafer conveyer robot gives the wafers to the wafer dipping/retrieving device, and the wafer dipping-/retrieving device dips and retrieves the wafers into and from a uniform flow of a treating solution in the container. At that time, the treatment solution inside the container forms a uniform flow from the inlet to the outlet of the container. Accordingly, if the composition of the treating solution is changed on the way, the old treatment solution is smoothly displaced out of the container through the outlet by a new treatment solution. The treatment solutions are thus replaced in the container. The wafers treated according to a predetermined treatment sequence with plural kinds of treatment solutions as described above are retrieved and conveyed into the wafer drying device by the wafer conveyer robot. The wafers dried in the wafer drying device are further loaded in a cassette by the wafer conveyer robot and the cassette loader.

As described above, a plurality of wafers loaded in a cassette can be automatically subjected to surface treatment, dried and loaded again in the cassette. Surface treatment with plural kinds of treatment solutions can be continuously carried out inside the container and also substitution of the treatment solutions can be rapidly conducted. Furthermore, wafers will not get in contact with air in substituting the treatment solutions, so that the wafers will not be contaminated by fine particles in the air.

As a result, a surface treatment system for wafers is provided which is capable of rapid and automatic surface treatment of surfaces of a plurality of wafers loaded in a cassette.

In another aspect of the present invention, a gate is device for a chemical is provided according to a preferred embodiment of the present invention and includes an outer wall defining a chemical agent introducing chamber having a first opening communicating with a flow path of a solvent and a second opening communicating with a flow path of a chemical agent and having a third opening at a portion opposing to the first opening, wherein the outer wall at a portion surrounding the first opening forms a valve seat. The gate device further includes a valve element holding rod having a valve element for sealing the first opening by closely contacting with the valve seat at its top end for opening and closing the first opening by sliding in the third opening, and a device for driving the valve element holding rod, wherein a head portion of the valve element is formed so that at least a part of it protrudes to the path of the solvent flow from a portion in contact with the valve seat with the first opening being sealed.

In the above-described gate device, the valve element opens and closes the first opening with the valve element holding rod sliding in the third opening. A chemical agent is introduced into the path of the solvent flow from the chemical agent introducing chamber accordingly. When the first opening is sealed by the valve element, the head portion of the valve element protrudes to the flow path side of the solvent from a portion where the valve element and the valve seat is in contact. Accordingly, a dead water region produced in the path of the solvent flow is small, so that there is little fear that bacteria will be produced in the dead water region, or that unnecessary remaining treatment solution makes composition of the next treatment solution imprecise. Furthermore, since the capacity formed between the portion being sealed to the path of the solvent flow is small, supply of the chemical agent into the path of the solvent flow is immediately stopped when the valve is closed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic block diagram of a conventional hermetically closed type wafer surface treatment apparatus.

FIG. 1A is a perspective view of a cassette for accommodating a plurality of wafers.

FIG. 10A is a perspective view of a wafer treatment system according to one embodiment of the present invention.

FIG. 10B is a perspective view of an external appearance of a robot for conveying a wafer used in combination with the system shown in FIG. 10A.

FIG. 11 is a schematic sectional view of the system shown in FIGS. 10A and 10B.

FIG. 14 is a flow chart of operation of the wafer treatment system shown in FIGS. 10A–13.

DESCRIPTION OF THE PREFERRED EMBODIMENTS

Figure 2:
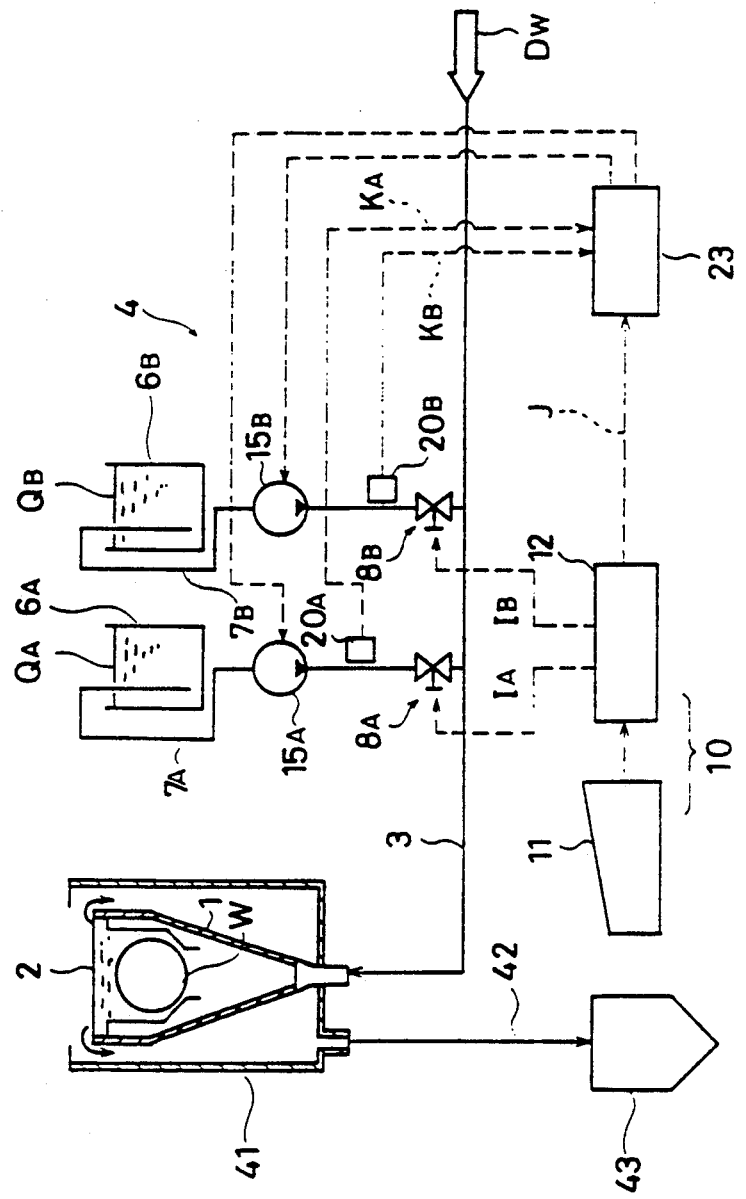
FIG. 2 is a diagram illustrating a principle structure of a wafer treatment apparatus according to the present invention.

Referring to FIG. 2, a wafer treatment apparatus according to the present invention basically includes a wafer treatment bath 1, a treatment solution supplying line 3 communicating with the lowest portion of wafer treatment bath 1 and connected to a supplying source of demineralized water $D_W$ to form a flow path thereof, and a treatment solution supplying unit 4 for supplying a predetermined quantity of chemical agents to treatment solution supplying line 3. The treatment solution 2 is supplied to wafer treatment bath 1.

Treatment solution supplying unit 4 includes chemical agent containers 6A, 6B on the upstream side of wafer treatment bath 1 communicating with treatment solution supplying line 3 through chemical agent supplying lines 7A, 7B and chemical agent introducing valves 8A, 8B for containing plural kinds of chemical agents, respectively. Chemical agent containers 6A, 6B contain predetermined chemical agents $Q_A$, $Q_B$ respectively.

The apparatus further includes a device for prescribing supply amount of chemical agents 10 for setting supply quantities of respective chemical agents $Q_A$, $Q_B$ depending on the kind of surface treatment and opening/closing controlling chemical agent introducing valves 8A, 8B according to the set quantities, pumps 15A, 15B provided in respective chemical agent supplying lines 7A, 7B for pressuring chemical agents provided from respective chemical agent containers 6A, 6B through chemical agent supplying lines 7A, 7B to chemical agent introducing valves BA, 8B, respectively, fluid meters 20A, 20B respectively provided between pump 15A and chemical agent introducing valve 8A, and pump 15B and chemical agent introducing valve 8B for measuring supplied quantities of chemical agents provided with pressure from pumps 15A, 15B and outputting them as measurement signals $K_A$, $K_B$, and a pump controller 23 responsive to output signals $K_A$, $K_B$ of fluid meters 20A, 20B and a control signal J indicative of the supplied quantities of chemical agents provided from the device for prescribing supply amount of chemical agents 10 for controlling pumps 15A, 15B so that predetermined amounts of chemical agents are provided into chemical agent introducing valves 8A, 8B.

Wafer treatment bath 1 is a container substantially V-shaped seen from the side which is formed of quarts glass as shown in FIG. 2. The plan form thereof is substantially rectangular. At a top portion of the V-shape of wafer treatment bath 1, or at the lowest portion of wafer treatment bath 1, a treatment solution supplying line 3 is connected in a direction so as to it coincides with a central axis of the V-shape. An upper portion of an outer wall of the wafer treatment bath is vertical and has its upper edge opened. Accordingly, treatment solution 2 supplied from treatment solution supplying line 3 into wafer treatment bath 1 rises in a uniform flow inside wafer treatment bath 1 and flows down along an outer portion of a peripheral wall of wafer treatment bath 1 from the upper edge of the outer wall of wafer treatment bath 1.

Around wafer treatment bath 1, a drain receptacle 41 for receiving the treatment solution flowing out of wafer treatment bath 1 is provided. Drain receptacle 41 is coupled to drain 43 through drain pipe 42.

The device for prescribing supply amount of chemical agents 10 includes a keyboard 11 with which an operator inputs a set amount of chemical agent, and a surface treatment controlling device 12 including a microcomputer (not shown) operating according to a predetermined program on the basis of data provided from keyboard 11 to output signals $I_A$, $I_B$ for controlling chemical agent introducing valves 8A, 8B and a control signal J for setting a supply amount to be supplied to pump controller 23 and the like.

The wafer treatment apparatus according to the present invention shown in FIG. 2 operates as follows.

Demineralized water $D_W$ is supplied inside wafer treatment bath 1 through treatment solution supplying line 3. Device for prescribing supply amount of chemical agents 10 respectively provides signals $I_A$, $I_B$ for implementing previously inputted supply amounts of chemical agents to chemical agent introducing valves 8A, 8B. Device for prescribing supply amount of chemical agents 10 further supplies a control signal J for setting supply amounts of chemical agents to pump controller 23. Chemical agent introducing valves 8A, 8B open and close independently of each other according to set treatment 25, sequences. Thus, required $Q_A$ or $Q_B$, or both of them are introduced into treatment solution supplying line 3. At that time, fluid meters 20A, 20B measure amounts of chemical agents flowing in chemical agent supplying lines 7A, 7B to provide them as respective signals $K_A$, $K_B$ to pump controller 23. Pump controller 23 controls the force-feed power of pumps 15A, 15B as required for introducing chemical agents $Q_A$, $Q_B$ into treatment solution supplying line 3 at a required rate in response to signal J and signals $K_A$, $K_B$ from device 10.

The demineralized water $D_W$ flowing in treatment solution supplying line 3 and a chemical agent introduced into the demineralized water $D_W$ are mixed and flow into wafer treatment bath 1 from its lowest portion. The treatment solution 2 rises inside wafer treatment bath 1 and then flows out of the upper edge of bath 1. That is, wafer treatment bath 1 is filled with a rising flow of treatment solution 2. Then, since the shape of wafer treatment bath 1 is V-shaped as shown in FIG. 2, the flow of treatment solution 2 inside wafer treatment bath 1 is substantially uniform. In order to obtain the desired uniformness, the vertical angle of the V-shape of wafer treatment bath 1 is preferably made 20° or smaller. The treatment solution flowing out of wafer treatment bath 1 is received by drain receptacle 41 and let out into drain 43 through drain pipe 42.

When wafer treatment bath 1 is filled up with treatment solution 2, the wafers W loaded in a cassette are dipped in wafer treatment bath 1. After applying surface treatment with predetermined treatment solution 2 to wafer W for a predetermined time, valves 8A, 8B are operated by device 10 for forming composition of another treatment solution according to a predetermined operation sequence. The sorts and amounts of chemical agents introduced into treatment solution supplying line 3 thus change. The new treatment solution is introduced into wafer treatment bath 1 following the treatment solution used before the composition was changed. As described above, a uniform rising flow of treatment solution 2 is formed in bath 1. Accordingly, the new treatment solution displaces the treatment solution 2 having old composition out of wafer treatment bath 1 in a short time and wafer treatment bath 1 is filled up with a uniform rising flow of the treatment solution 2 having new composition. Thus, treatment of wafers W with new substituted treatment solution 2 is continued.

At the end of the treatment, wafers W loaded in the cassette are taken out of wafer treatment bath 1. At that time, supply of treatment solution 2 into wafer treatment bath 1 does not have to be stopped. This is because, in departure from ones of hermetically closed type of conventional art, wafer treatment bath 1 is of an open-type.

When treating following wafers W, treatment solution inside wafer treatment bath 1 is substituted by a new treatment solution 2 again by changing open/close states of chemical agent introducing valves 8A, 8B. Thus, the following wafers W can be subjected to surface treatment.

In a dipping type wafer treatment apparatus having a principle structure as shown in FIG. 2, amounts of chemical agents supplied into treatment solution supplying line 3 are controlled to always stay at predetermined values by fluid meters 20A, 20B, pump controller 23 and pumps 15A, 15B. Amounts of chemical agents introduced into treatment solution supplying line 3 do not fluctuate due to the inner pressure inside chemical agent containers 6A, 6B and the remaining amounts of chemical agents $Q_A$, $Q_B$ Accordingly, the composition of treatment solution 2 for treating wafer W can be precisely maintained, resulting in good surface treatment of wafer W.

With device 10 for prescribing supply amount of chemical agents and chemical agent introducing valves 8A, B, the sorts of chemical agents introduced into the treatment solution can be arbitrarily changed. Also, pump controller 23 modulates pressure pumps 15A, 15B on the basis of supply amounts of chemical agents set by device 10 in advance corresponding to plural kinds of surface treatments. Thus, in each surface treatment, introduced amounts of respective chemical agents $Q_A$, $Q_B$ can be precisely adjusted. Accordingly, in plural kinds of surface treatments of wafer W, composition of treatment solution 2 can be arbitrarily changed, so that continuing plural kinds of surface treatments can be made continuously without moving wafers W from wafer treatment bath 1.

Treatment solution 2 forms a uniform rising flow in wafer treatment bath 1. Wafer treatment bath 1 is always overflowing. When treatment solution 2 supplied from treatment solution supplying line 3 is substituted by one with new composition, the new treatment solution 2 smoothly displaces the treatment solution 2 with old composition from wafer treatment bath 1. It is possible to rapidly substituting treatment solutions 2 for each of plural kinds of surface treatment steps while keeping wafer treatment bath 1 being filled up with treatment solution 2. Accordingly, wafers W will never get in contact with air until a series of surface treatments are finished. There is little fear of formation of an oxide film on a wafer surface or contamination with impurities in the air. Wafer W can be put into and taken out of surface treatment without emptying wafer treatment bath 1. Accordingly, surface treatment of wafer W can be rapidly and well conducted.

In the principal structure shown in FIG. 2, fluid meters 20A, 20B are provided at chemical agent introducing lines 7A, 7B. However, positions at which they are provided are not limited to as shown in FIG. 2. For example, they may be provided on the downstream of chemical agent introducing valves 8A, 8B of treatment solution supplying line 3.

In this case, a certain space remains between chemical agent introducing valves 8A, 8B and treatment solution supplying line 3, which is preferably as small as possible. This is because the space serves as a dead space where a chemical solution could stay and make the composition of treatment solution imprecise, or may facilitate appearance of bacteria in the treatment solution.

In the principal structure shown in FIG. 2, wafers W are dipped into wafer treatment bath 2 as being loaded in a cassette. However, the present invention is not limited thereto, and wafers W may be taken out of the cassette, and only wafers W may be dipped into wafer treatment bath 1.

Some modified examples of the above-mentioned embodiment are described in the embodiments below.

Figure 3:
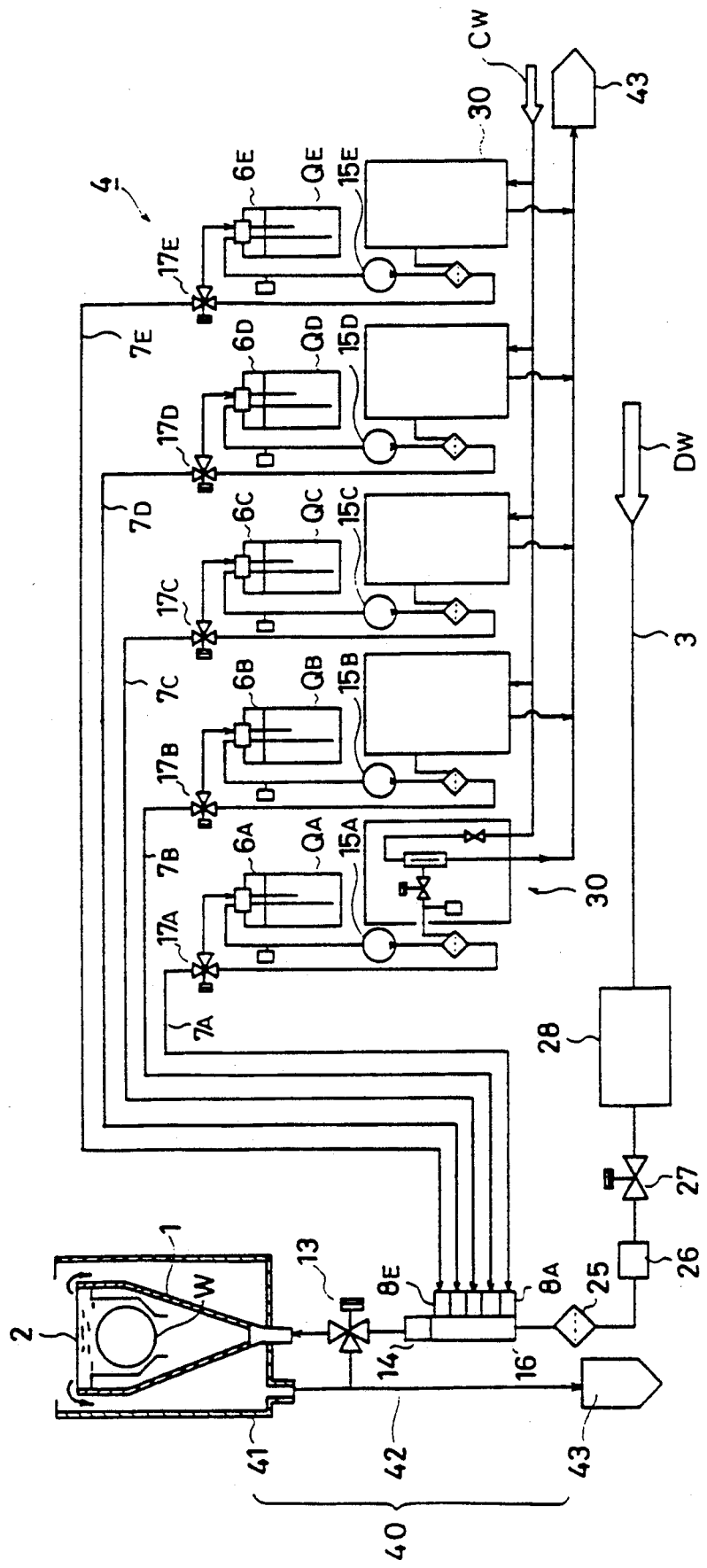
FIG. 3 illustrates the schematic structure of a wafer treating apparatus according to one embodiment of the present invention.

FIG. 3 is a diagram illustrating the schematic structure of an apparatus for treating wafers according to another embodiment of the present invention. Referring to FIG. 3, the dipping type wafer treatment apparatus basically includes a wafer treatment bath 1, treatment solution supplying line 3 communicating with the lowest portion of wafer treatment bath 1 in which demineralized water $D_W$ flows, a treatment solution supplying unit 4 for introducing desired $Q_A$ - $Q_E$ into treatment solution supplying line 3, and a treatment solution drawing unit 40 for drawing treatment solution 2 from wafer treatment bath 1. Wafer treatment bath 1 is a hollow container having its side V-shaped and its plan view substantially rectangular. Bath 1 is formed of quartz glass as described above. The vertical angle of the V-shape of wafer treatment bath 1 is preferably 20° or smaller. The upper part of wafer treatment bath 1 has a width sufficiently large for dipping of wafers W and its side face vertical at its top portion.

Treatment solution drawing unit 40 includes a drain receptacle 41 provided surrounding wafer treatment bath 1 for receiving treatment solution 2 let out from a treatment solution outlet at an upper portion of wafer treatment bath 1, a drain pipe 42 communicating with drain receptacle 41 at its one end, and a drain 43 provided at the other end.

In treatment solution supplying line 3, from wafer treatment bath 1 toward the upstream, there provided a selector valve 13, a static mixer 14 for mixing a chemical agent introduced into the treatment solution supplying line and demineralized water, a valve coupler 16 to which chemical agent introducing valves 8A-8E for introducing chemical agents into treatment solution supplying line 3 are connected, demineralized wafer filter 25, a demineralized wafer fluid meter 26, a gate valve 27, and a demineralized water heater 28 for heating demineralized water to a given temperature.

Selector valve 13 usually supplies demineralized water $D_W$ or treatment solution 2 to wafer treatment bath 1. Selector valve 13 can discharge treatment solution 2 inside wafer treatment bath 1 to drain 43 through drain pipe 42, as needed.

Figure 4:
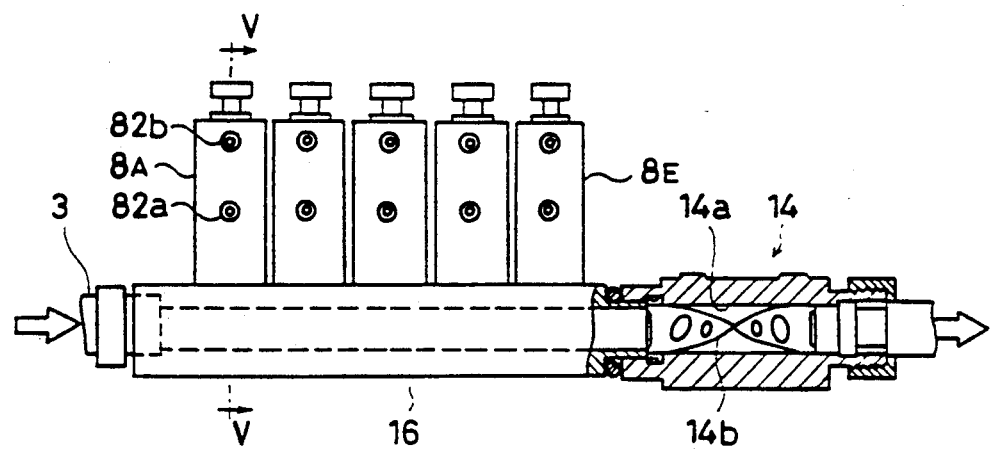
FIG. 4 is a partially broken side view of a chemical agent valve used in one embodiment of the present invention.

Static mixer 14 includes, referring to FIG. 4, for example, mixer line 14a included in a part of treatment solution supplying line 3, and a torsion plate 14b fixed inside mixer line 14a for uniformly mixing demineralized water $D_W$ and chemical agents $Q_A$ - $Q_E$. It should be noted that other kinds of mixers can be employed instead of the static mixer, and that if treatment solution supplying line 3 on the downstream of static mixer 14 is sufficiently long, such a mixer can be omitted.

Valve coupler 16 is constructed by chemical agent introducing valves 8A-8E coupled in a series for controlling as to whether or not chemical agents $Q_A$ - $Q_E$ which are fed with pressure inside chemical agent supplying lines 7A-7E from treatment solution supplying unit 4 are to be introduced into treatment solution supplying line 3. The details thereof will be described later referring to FIGS. 4, 5.

Figure 3A:
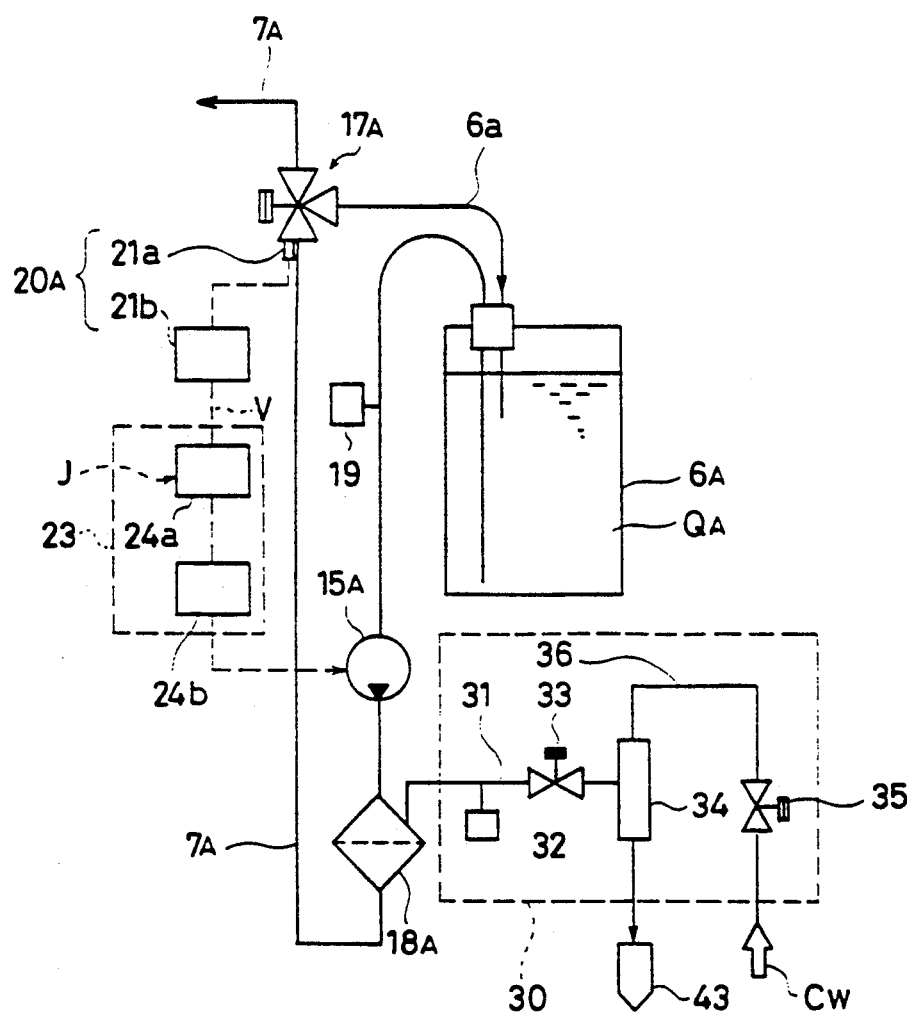
FIG. 3A illustrates the schematic structure of a part supplying chemical agent $Q_A$ to a treatment bath.

Treatment solution supplying unit 4 includes chemical agent containers 6A-6E for containing chemical agents $Q_A$ - $Q_E$, chemical agent supply lines 7A-7E for respectively connecting chemical agent containers 6A-6E to treatment solution supplying line 3 on the upstream of wafer treatment bath 1, chemical agent introducing valves 8A-8E as gating means for opening and closing a portion at which each of chemical agent supplying lines 7A-7E and treatment solution supplying line 3 are coupled, and pressure pumps 15A-15E for feeding chemical agents $Q_A$ $Q_E$ with pressure to treatment solution supplying line 3. Treatment solution supplying unit 4 further includes a device for prescribing supply amount of chemical agents, a fluid meter, and a pump controller. In FIG. 3, those are not shown to simplify the figure. They are shown only in FIG. 2. FIG. 3A schematically illustrates a portion for supplying chemical agent $Q_A$. Referring to FIG. 3A, from chemical agent supplying line 7A toward chemical agent container 6A, sequentially, there are provided a three-way valve 17A, a chemical agent filter 18A and a liquid drawing device 30, a magnet type pressure pump 15A and a flow detector 19 for detecting a flow of chemical agent $Q_A$ in chemical agent supplying line 7A.

Fluid meter 20A for measuring a supply amount of chemical agent $Q_A$ includes a pressure transducer 21a provided in three-way valve 17A, and a pressure gauge 21b for converting an output signal of pressure transducer 21a into an analog signal V and outputting the same, and for displaying a supply pressure of a chemical agent detected by pressure transducer 21a.

Pump controller 23 includes a regulator 24a for modulating a chemical agent supply pressure signal V on the basis of the signal V and the control signal J from the surface treatment controlling device, and a pump driving circuit 24b for outputting a pump controlling signal for controlling pump 15A in response to an output signal of regulator 24a.

Fluid meter 20A and pump controller 23 drive pump 15A to feed prescribed supply amount of chemical agent Q into chemical agent supplying line 7A according to the expression:

$$Q = \alpha F(2P/\eta)^{\frac{1}{2}}$$

wherein $\alpha$ is a flow coefficient, F is a minimum sectional area of valve seat 84b of chemical agent introducing valve 8 described later (refer to FIG. 5), P is a difference between a supply pressure $V_0$ of demineralized water $D_W$ and chemical agent supply pressure v, $\eta$ is a fluid density of chemical agent $Q_A$.

Pressure pumps 15A-15E are controlled according to the above expression. In the embodiment, the supply pressure $V_0$ of demineralized water is kept constant and the supply pressures $V_A$ - $V_E$ of chemical agents $Q_A$ - $Q_E$ are adjusted.

In a wafer treatment apparatus according to the present embodiment, wafers can be treated with treatment solutions changed by the following program.

Step 1: demineralized water + $Q_A$ + $Q_E$
Step 2: demineralized water
Step 3: demineralized water + $Q_B$
Step 4: demineralized water
Step 5: demineralized water + $Q_C$ + $Q_E$
Step 6: demineralized water (end of treatment)

In this process, chemical agents in chemical agent containers 6A-6E are $NH_4OH$, HF, HCl, choline and $H_2O_2$, respectively. For example, in order to mix HCl, $H_2O_2$ and demineralized water at a volume ratio of 1:5 in step 5, discharging pressures $v_C$, $v_E$ of respective pumps 15C, 15E are set to implement flow rate ratio of 1:5.

Depending on the contents of the process of surface treatment, the above-described steps 4-6 may be changed as follows, for example.

Step 4: demineralized water + $Q_D$
Step 5: demineralized water (end of treatment)

Also, treatment solutions 2 supplied into wafer treatment bath 1 in respective steps according to the contents of surface treatments can be changed as required.

Referring to FIG. 3A, liquid drawing device 30 is provided because magnet type pressure pump 15A is not of self-drawing type. Device 30 includes a liquid drawing tube 31 having its one end connected to chemical agent filter 18A, an aspirator 34 connected to the other end of liquid drawing tube 31, a service water tube 36 for producing negative pressure in the liquid drawing tube 31 by service water $C_W$ flowing therein in aspirator 34, a flow detector 32 provided in liquid drawing tube 31 for detecting whether a chemical agent is flowing in liquid drawing tube 31 or not, and valves 33 and 35 respectively provided in liquid drawing tube 31 and service water tube 36. Service water tube 36 is coupled to drain 43.

Liquid drawing device 30 operates as follows. Valves 33, 35 are opened and then service water flows inside service water tube 36. A negative pressure is produced inside liquid drawing tube 31. By the negative pressure, chemical agent $Q_A$ is drawn into liquid drawing tube 31 through chemical agent supplying line 7A from chemical agent container 6A. The chemical agent $Q_A$ is also necessarily drawn into pump 15A. Flow detectors 19 and 30 detect the chemical agent $Q_A$ drawn into chemical agent supplying line 7A and liquid drawing tube 31. In response to the detection, the valves 33, 35 are closed. Pressure pump 15A starts working and three-way valve 17A is closed. A flow-back pipe 6a is provided from three-way valve 17A to chemical agent container 6A. With operation of pump 15A, the chemical agent flows back to chemical agent container 6A through pump 15A, demineralized water filter 18A, three-way valve 17A, and flow-back pipe 6a. Air is thus eliminated from chemical agent supplying line 7A.

It should be noted that liquid drawing device 30 is not required if pump 15A is a self-drawing type pump.

If the supply pressure of demineralized water supplied to treatment solution supplying line 3 fluctuates, the chemical agent supply amount Q can be precisely controlled by the following. First, a pressure sensor is provided in treatment solution supplying line 3. A signal corresponding to difference between an output of the pressure sensor and an output of pressure transducer 21a shown in FIG. 3A is inputted in pump controller 23. Thus, chemical agent supply amount Q can be precisely controlled even when the supply pressure of demineralized water fluctuates.

Chemical agent introducing valves 8A-8E are fixed to valve coupler 16 provided in treatment solution supplying line 3 on the upstream of static mixer 14, referring to FIG. 4. Each of introducing valves 8A-8E is connected to communicate with treatment solution supplying line 3 through valve coupler 16.

Figure 5:
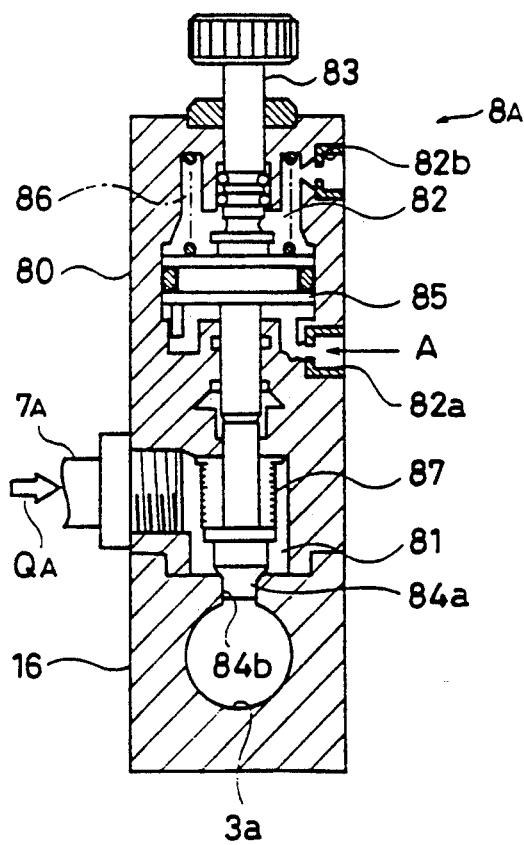
FIG. 5 is a cross-sectional view taken along the V—V line in FIG. 4.

Referring to FIGS. 4, 5, valve coupler 16 has a flow tube 3a for a treatment solution inside. An opening is provided at a portion to which chemical agent introducing valve 8A is coupled in valve coupler 16, and a peripheral portion thereof works as a valve seat 84b.

Chemical agent introducing valve 8A includes a valve body 80 having a chemical agent introducing chamber 81 formed in a partition at its lower portion and a valve driving chamber 82 formed in a partition at its upper portion. An opening is formed over chemical agent introducing chamber 81 and valve driving chamber 82 for receiving a valve rod 83. At an end of valve rod 83 inside chemical agent introducing chamber 81 which is inserted through the opening, a valve element 84a capable of closely contacting with valve seat 84b is fixed. Opposing to valve seat 84b, between a wall face of chemical agent introducing chamber 81 and valve element 84a, a bellows tube 87 for sealing chemical agent is provided. The above-mentioned valve rod 83 is inserted through the bellows 87. At a side portion of chemical agent introducing chamber 81, an opening is formed to which chemical agent supplying line 7A is connected.

An air piston 85 is fixed at valve rod 83 in valve driving chamber 82 for dividing valve driving chamber 82 into two, upper and lower portions. An opening 82a for supplying compressed air A into valve driving chamber 82 is formed on an outer wall of valve body 80 defining the lower valve driving chamber 82 divided by air piston 85. An opening 82b through which air in valve driving chamber 82 comes in and goes out is formed in valve body 80 defining the upper valve driving chamber 82. A compression spring 86 for biasing air piston 85 downward is further provided in valve driving chamber 82 above air piston 85.

The chemical agent introducing valve 8A operates as follows. Air piston 85 is usually biased downwards by compression spring 86. Valve rod 83 is moved to valve coupler 16 side, valve element 84a is received by valve seat 84b, and chemical agent supplying line 7A and treatment solution flowing line 3a are separated.

With compressed air A being supplied from opening 82a into valve driving chamber 82, air piston 85 overcomes the biasing power of compression spring 86 and moves upwards. At that time, the air in the upper valve driving chamber 82 escapes out from opening 82b. Valve rod 83 and valve element 84b also move upwards together with air piston 85, and chemical agent supplying line 7A and treatment solution flowing line 3a communicate with each other. Chemical agent $Q_A$ is pressurized by a pump as described above, so that the chemical agent $Q_A$ is introduced into treatment solution supplying line 3a.

Referring to FIG. 5, valve element 84a is received in valve seat 84b formed at valve coupler 16. With the valve being closed, as clearly seen from FIG. 5, the opening between treatment solution flowing line 3a and chemical agent introducing chamber 81 is mostly occupied by valve element 84a. Accordingly, almost no space remains between valve element 84a and treatment solution flowing line 3a. Only a small amount of treatment solution stays in this portion. Even if a long time passes with valve 8A being closed, there is little fear of appearing of bacteria inside the demineralized water in treatment solution flowing line 3a and of remaining of unnecessary chemical agents in treatment solution supplying line 3a. The timing of introducing chemical agent $Q_A$ into treatment solution flowing line 3a and the timing of stopping the introduction can be precisely controlled, to keep the concentration of chemical agents in the treatment solution precisely.

Figure 6:
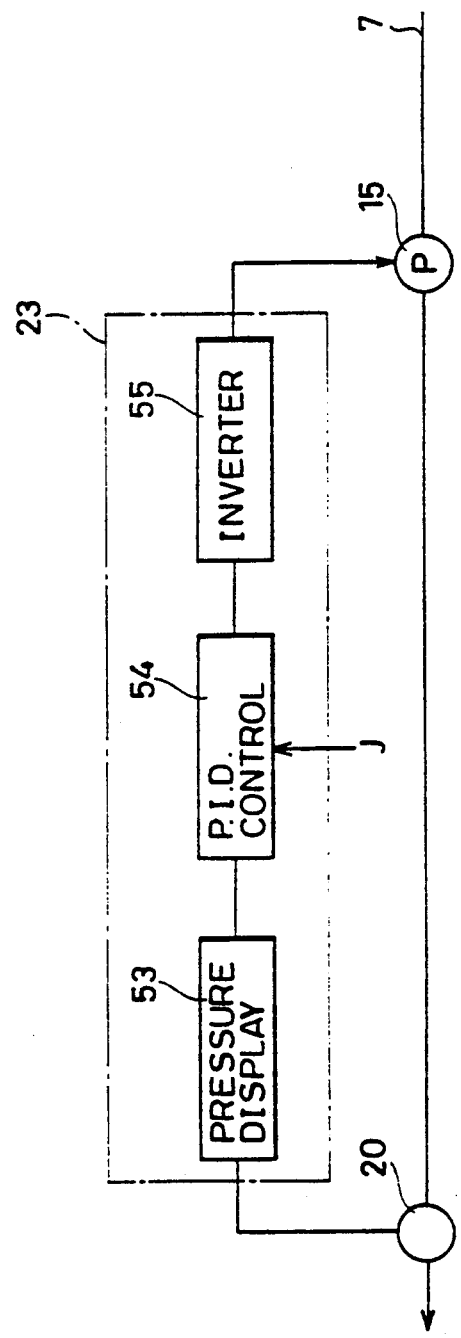
FIG. 6 is a block diagram illustrating the schematic structure of a pump controlling device.

The control of a pump by pump controller 23 is performed in a manner as shown in FIG. 6. Referring to FIG. 6, pump controller 23 includes a pressure display 53 connected to fluid meter 20 provided in chemical agent supplying line 7, a P.I.D. (Proportional Integral and Differential) controller 54 for outputting a signal for pump control on the basis of P.I.D. control on the basis of an output signal of fluid meter 20 converted into an analog signal by pressure display 53 and a control signal J provided from the device for prescribing supply amount of chemical agents, and an inverter 55 for modulating and controlling voltage to be provided to pump 15 on the basis of an output from P.I.D. controller 54 to change the force feed power of pump 15.

Referring to FIG. 6, pump controller 23 controls pump 15 as follows. Pressure display 53 displays pressure in response to an output signal of fluid meter 20 and also converts an output of fluid meter 20 into an analog signal and provides the same to P.I.D. controller 54. P.I.D. controller 54 performs conversion in accordance with the above-mentioned calculation expression on the basis of a signal provided from pressure display 54 and a control signal J provided from the device for prescribing supply amount of chemical agents to calculate a value to be the pressure feed force of pump 15 and provides a signal indicative of the value to inverter 55. Inverter 55 calculates power to be provided to pump 15 on the basis of the signal provided from P.I.D. controller 54 and modulates drive voltage provided to pump 15 to change the pressure feed force of pump 15.

Figure 7:
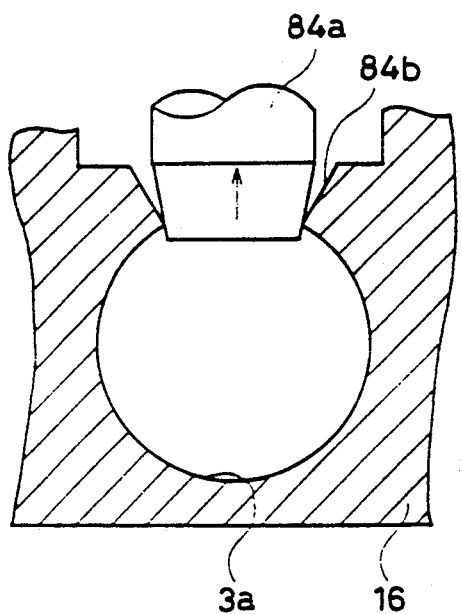
FIGS. 7 and 8 are cross-sectional views of a main portion of a valve illustrating shapes of valve seats and valve elements of valve devices according to other embodiments of the present invention.
Figure 8:
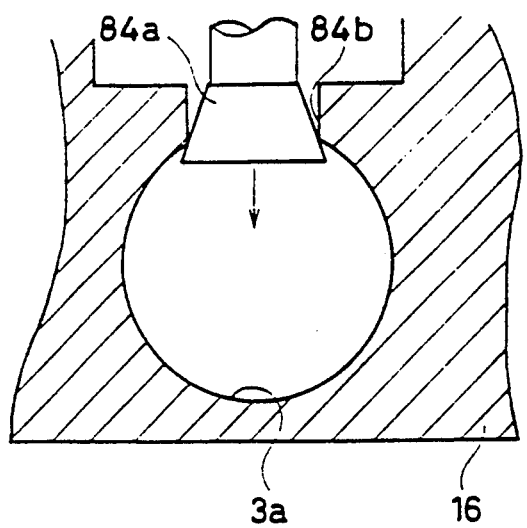

In the apparatus shown in FIG. 5, a valve having valve element 84a and valve seat 84b whose shapes substantially mate with each other has been shown. However, shapes of a valve seat and a valve element are not limited to the same. For example, referring to FIG. 7, it can be a shape in which an angle of inclination of a head of valve element 84a is smaller than an angle of inclination of valve seat 84b and the top of valve element 84a somewhat protrudes in treatment solution flowing line 3a when the valve seat 84b is closed. Also, a valve element 84a having a form as shown in FIG. 8 may be used as a valve element 84a. Referring to FIG. 8, a head portion of valve element 84a has a shape of frustum of a cone in which the diameter increases toward the top. The valve opens with valve element 84a protruding into treatment solution flowing line 3a. Using a combination of valve element 84a and valve seat 84b having such shapes as shown in FIGS. 7 and 8, eliminates concerns regarding formation of a dead area in treatment solution flowing line 3a, of the appearance of bacteria in the demineralized water or of mixing of unnecessary chemical agents into a treatment solution.

A valve driven by compressed air has been shown in FIG. 5. However, the present invention is not limited to the same, and a valve driven by a driving method other than compression air, e.g., an electromagnetic opening/closing valve can also be used.

Figure 9:
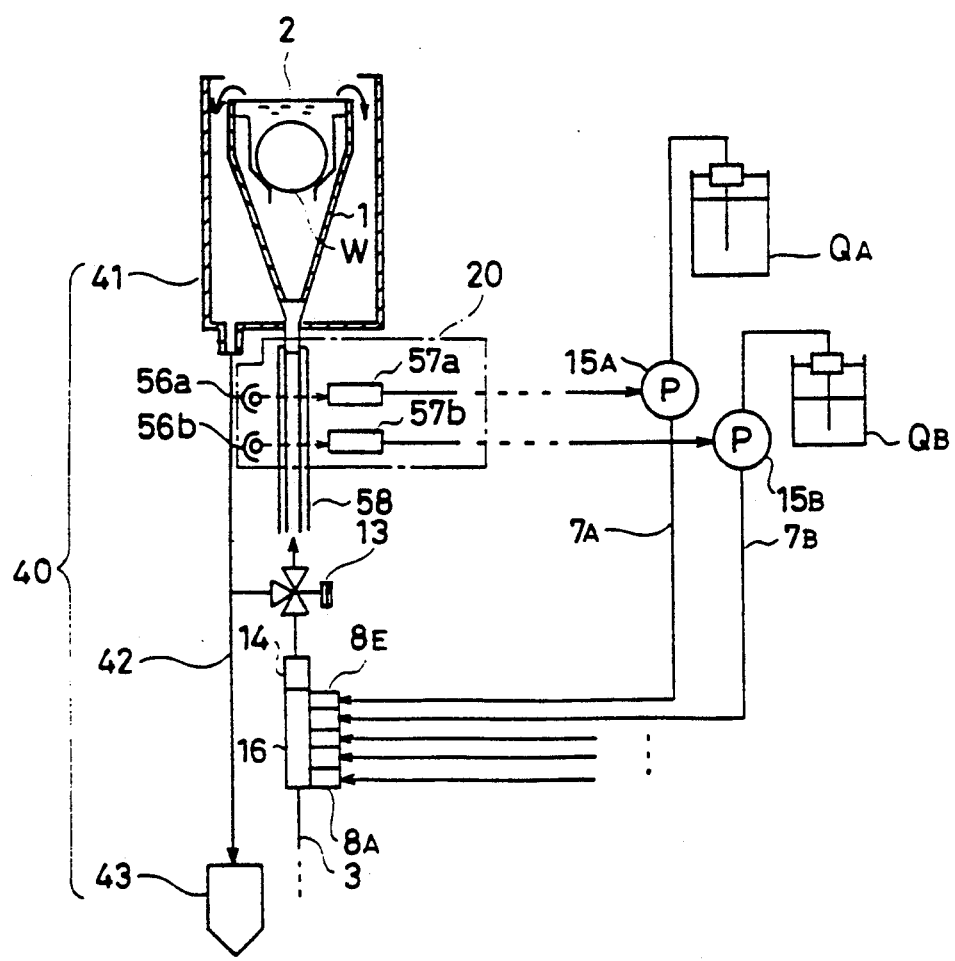
FIG. 9 is a schematic diagram of a mechanism for detecting a concentration of a chemical agent in a treatment solution in another embodiment of the present invention.

FIG. 9 shows a modified example of a fluid meter 20 in the first embodiment described above. Referring to FIG. 9, in this modified example, the treatment solution supplying line between wafer treatment bath 1 and selector valve 13 is a transparent pipe 58. A device 10 for prescribing supply amount of chemical agents in this modified example includes light sources 56a, 56b and light sensors 57a and 57b oppositely provided with transparent pipe 58 provided therebetween. Light sensor 57a is for detecting a light having wavelength of 300 nm, for example, and light sensor 57b is for detecting a light having if wavelength of 2200 nm, for example. As to the chemical agents described above, it is known that hydrogen peroxide absorbs a light of wavelength of 300 nm and ammonia absorbs a light with wavelength of 2200 nm, respectively. Accordingly, concentrations of hydrogen peroxide and ammonia can be calculated from light intensities of these wavelengths. Controlling pumps 15a, 15b on the basis of calculated values, a concentration of each chemical agent, e.g., hydrogen peroxide and ammonia, in a treatment solution flowing in treatment solution supplying line 3 can be precisely controlled.

FIGS. 10A and 10B are schematic perspective view of external appearance of a wafer treatment system using a wafer treatment apparatus according to the present invention. Referring to both figures, the system includes a cassetteless wafer treatment unit 61 for taking out wafers from a cassette and applying surface treatment thereto, a wafer conveyor unit 62 for conveying wafers among respective units included in cassetteless wafer treatment unit 61.

Referring to FIG. 10A, cassetteless wafer treatment unit 61 includes a cassette loader 64 for moving wafers from a cassette to wafer conveyor unit 62 before treatment and moving the wafers after treatment from wafer conveyor unit 62 to the cassette, a wafer treatment apparatus 66 according to the present invention provided along a wafer conveying path by wafer conveyor unit 62 for treating wafers dipped into a treatment solution, wafer dryer 65 provided along the wafer conveying path by wafer conveyor unit 62 for drying the wafers surface-treated by wafer treatment apparatus 66 with the wafers being rotated outside the cassette, and a high efficiency particulate air filter (HEPA) 63 provided above cassette loader 64, wafer dryer 65 and wafer treatment apparatus 66 for supplying air including no fine particles as a contaminant source thereto.

As the wafer conveyor unit 62 shown in FIG. 10B, what is disclosed in Japanese Patent Laying-Open No. 2-76227 or Japanese Patent Laying-Open No. 2-47046 is available, for example. Referring to FIGS. 10B and 11, wafer conveyor unit 62 includes a lifting rod 121 movable in a horizontal direction by a horizontal direction conveyor mechanism not shown and movable upward and downward by an up/down mechanism not shown, and a wafer conveyor robot 62 attached to an upper end of lifting rod 121.

Wafer conveyor robot 67 includes a pair of parallel arms 99, two pairs of wafer holding frames 98 provided protruding downwards in parallel bellow each of arms 99, two pairs of wafer holding rods 100 each pair provided in parallel in the vicinity of ends of each single pair of wafer holding frames 98 for holding wafers at their sides, and an arm driving mechanism 97 fixed at an upper end of lifting rod 121 for pivoting arm 99 by a predetermined angle around its central axis.

Grooves into which outer peripheries of wafers W are inserted are formed in an inner side portion of each wafer holding rod 100. Arm driving mechanism 97 rotates arm 99 to open wafer holding frames 98 to opposite sides by a predetermined angle as shown in FIG. 11. By positioning wafers at the same level as wafer holding rod 100 between wafer holding frames 98 and closing wafer holding frames 98 again, the wafers are held by wafer holding rods 100. With lifting rod 121 moving left, right, up and down as shown in FIG. 11, wafers W can be conveyed to predetermined positions with respect to cassette loader 64, wafer treatment apparatus 66 and wafer dryer 65.

Apparatus similar to the cassette loader 64 shown in FIGS. 10A, 11 are disclosed in Japanese Patent Laying-Open No. 63-164229, Japanese Patent Laying-Open No. 62-26034, the above-identified Japanese Patent Laying-Open No. 2-76227, Japanese Patent Laying-Open No. 2-47046, for example.

Referring to FIG. 11, cassette loader 64 includes a cassette table 70 on which a cassette C having such an opening in its bottom as described above is placed and having an opening formed at a position which coincides with the opening of cassette C, and an air cylinder 68 provided below the opening of cassette table 70 for push up wafers W upwards from cassette C.

A wafer receptacle 69 for supporting wafers W is attached at a top end of a rod of air cylinder 68. A groove 69a for preventing wafers W from falling is formed at a portion in contact with lower edges of wafers W.

Wafer treatment apparatus 66 includes a wafer treatment bath 1 for containing a uniform rising flow of a treatment solution 2, a drain receptacle 41 provided around an upper edge of wafer treatment bath 1 for receiving treatment solution 2 flowing out of wafer treatment bath 1 and guiding it into a drain, a treatment solution supplying unit not shown for supplying treatment solution 2 into wafer treatment bath 1 through treatment solution supplying line 3 communicating with the lowest portion of wafer treatment bath 1, and a wafer lifting apparatus 120 for receiving wafers W from wafer conveyor robot 67, dipping them into treatment solution 2 in wafer treatment bath 1, retrieving wafers W from treatment solution 2 after end of predetermined treatments and returning them to wafer conveyor robot 67.

Wafer lifting apparatus 120 includes lifting driving mechanism 122 fixed at a side portion of a housing in which the wafer treatment bath 1 is provided, a pair of parallel arms 123 provided at ends of a rod of lifting driving mechanism 122 protruding in an upper portion of wafer treatment bath 1, wafer holding frames 124 provided protruding downward parallel with each other from ends of arms 123, and wafer holding rods 125 fixed on both sides at a lowest portion of wafer holding frame 124 between the pair of wafer holding frames 124 to be parallel with each other. On a surface of wafer holding rod 125 in contact with wafers, grooves for preventing wafers W from falling are formed.

A wafer dryer similar to wafer dryer 65 is disclosed in Japanese Patent Laying-Open No. 1-255227, for example. Referring to FIG. 11, wafer dryer 65 includes a box shaped housing 72 having a cover 71 capable of opening and closing at its upper portion, a rotor 75 provided in housing 72 for holding a plurality of wafers W laterally in parallel and rotating them around a horizontal rotation axis center P, and a driving mechanism 77 provided in an edge region of housing 72 for rotating rotor 75.

Figure 13:
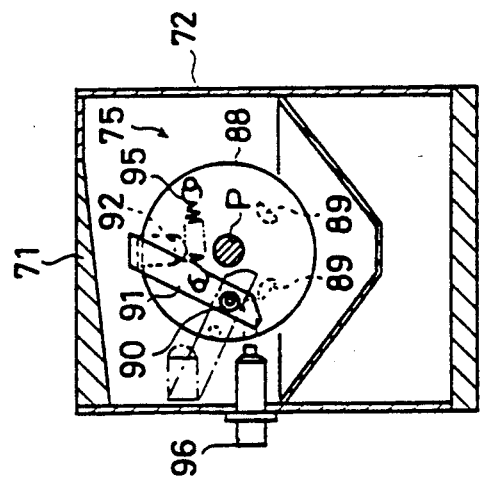
FIG. 13 is a cross-sectional view of a wafer dryer taken along the XIII—XIII line of FIG. 12.
Figure 12:
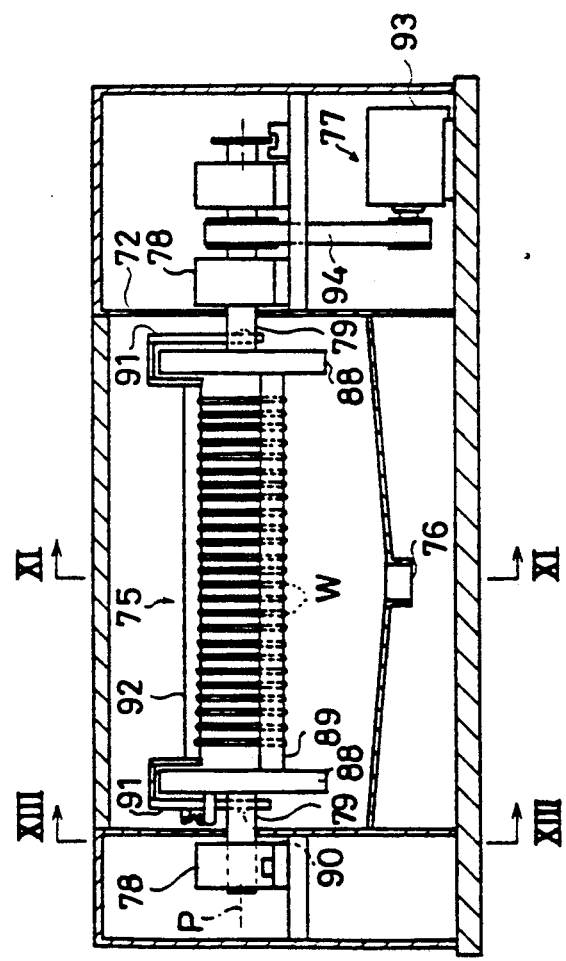
FIG. 12 is a side sectional view taken along the XII—XII line of the rotary type wafer dryer shown in FIG. 11.

Referring to FIGS. 11-13, rotor 75 includes a pair of rotation axes 79 provided on the same axis center through a pair of bearings 78 provided on both sides of housing 72, a pair of fly wheels 88 of a large diameter respectively fixed at ends of respective rotation axes 79, a pair of wafer holding rods 89 fixed over two fly wheels 88 for holding wafers W at their upper portions, a pair of arms 91 pivotablly coupled around a fulcrum 90 (refer to FIG. 13) on an outer surface of each fly wheel 88, a movable wafer holding rod 92 which can be moved with arms 91 fixed over the pair of arms 91 for putting down wafers W held by wafer holding rod 89 and fixing them.

Referring to FIG. 13, a spring 95 for biasing arms 91 to displace movable wafer holding rod 92 to a position where wafers W are fixed is provided on an outer face of one of fly wheels 88. In housing 72 on the side of fly wheel 88, an air cylinder 96 is provided for displacing arms 91 by overcoming the biasing force of spring 95 protruding beyond fulcrum 90 around fulcrum 90 and rotating the ends of arm 91. When air cylinder 96 overcomes the biasing force of spring 95 to displace arms 91, movable wafer holding rod 92 can separate from wafer W and wafers W can be can be taken out from wafer dryer 65. When air cylinder 96 withdraws, movable wafer holding rod 92 fixes wafers W at wafer holding rods 89.

Driving mechanism 77 includes a motor 93 fixed at housing 72 and a belt 94 for transmitting rotation of the rotation axis of motor 93 to one of rotation axes 79.

Referring to FIG. 11, an air inlet including a filter through which clean air or inactive gas is introduced into housing 1 is provided at an appropriate position on an upper portion of housing 72. On a side of housing 72, an air outlet 74 connected to a pressure reducing means such as a vacuum pump not shown is provided. A drain outlet 76 for collecting and letting out solution scattering from a surface of wafers W is provided bellow rotor 75.

A pair of wafer holding rods 78 and movable wafer holding rod 72 fix wafers W so that wafers W are coaxial with rotation axis center P. Accordingly, with rotation axes 79 being rotated at a high speed, solution scatters around from the surface of wafers W and the wafers W are dried.

In FIG. 11, there is not shown a treatment solution supplying unit for supplying treatment solutions into wafer treatment bath 1 of wafer treatment apparatus 66. However, Such a treatment solution supplying unit as shown in FIGS. 2-5, for example, can be applied to the apparatus shown in FIG. 11 as it is. Accordingly, a treatment solution supplying unit is not shown in FIG. 11 to simplify the figure.

FIG. 14 is a flow chart illustrating procedures of operation of a system shown in FIGS. 10A-13. Referring to FIGS. 14, 10A-13, the system operates as follows.

First, in step S1, demineralized water is supplied via treatment solution supplying line 3 into wafer treatment bath 1. Treatment bath 1 will overflow. The overflowing demineralized water is collected by drain receptacle 41 and guided to outside.

In step S2, air cylinder 68 expands and unloads wafers W from cassette C provided on cassette table 70 shown in FIG. 11. Wafer receptacle 69 at the end of the rod of air cylinder 68 passes cassette table 70 and the opening of cassette C, holds the wafers W in grooves 69a at an upper portion of wafer receptacle 69 and lifts the wafers up above the cassette C. The lifted wafers are held by wafer conveyor robot 67. After wafer conveyor robot 67 receives the wafers, wafer receptacle 69 descends a little. Thus, wafer conveyor robot 67 can convey wafers W to left and right.

Subsequently, in step S3, wafers W are conveyed to a position above wafer treatment apparatus 66 by wafer conveyor robot 67. Wafer conveyor robot 67 lowers wafers W at this position and holds them at a predetermined point. Wafer lifting apparatus 120 moves upwards and wafers W abut against upper face of wafer holding rods 125. Wafer lifting apparatus 120 further lifts up wafer holding rods 125 a little, and wafers W are thus moved from wafer conveyor robot 67 to wafer holding rods 125. In this condition, arms 99 of wafer conveyor robot 67 opens left and right, and wafers W are completely transferred to wafer lifting apparatus 120.

Subsequently, in step S4, wafer lifting apparatus 120 descends. Wafers W are thus dipped into treatment solution 2 in wafer treatment bath 1.

In step S5, required ones of valves 8A-8E shown in FIG. 3 are opened corresponding to composition of a treatment solution to be obtained. Thus, treatment solution 2 inside wafer treatment bath 1 is replaced from demineralized water to a treatment solution having a given composition.

Next, in step S6, a determination is made as to whether a treatment time of the first step has passed or not. The determination is repeated until the treatment time has passed.

In step S7, valves 8A-8E are closed. Thus, treatment solution 2 in wafer treatment bath 1 is replaced from the treatment solution having given composition to demineralized water $D_W$.

In step S8, a determination is made as to whether a time predetermined for rinsing has passed or not. Wafers W are rinsed with demineralized water during this period. After time for rinsing has passed, the treatment proceeds to step S9.

It should be noted that treatment in steps S4-S7 can be repeated for the required number of times. In FIG. 14, the repeat is not illustrated to simplify the figure.

In step S9, wafer lifting apparatus 120 ascends. Thus, wafers W are taken out of treatment solution 2 in wafer treatment bath 1.

In step S10, wafers W are transferred from wafer lifting apparatus 120 to wafer conveyor robot 67. This transfer is made according to processes right opposite to those in transferring the wafers from wafer conveyor robot 67 to wafer lifting apparatus 120.

In step S11, wafer conveyor robot 67 conveys wafers W to and above wafer dryer 65. Cover 71 of wafer dryer 65 is opened, and wafer conveyor robot 67 lowers wafers W into housing 72 until lower edges of wafers W abut against upper faces of wafer holding rods 89. At this time, arms 91 have been withdrawn by air cylinder 96 in advance so that it does not interfere with transfer of wafers W. Subsequently, air cylinder 96 withdraws so that arms 91 pivot around fulcrum 90 by the biasing force of spring 95, and movable wafer holding rod 92 presses the upper edges of wafers W and fixes the wafers W. Wafer conveyor robot 67 opens its arms 99 in opposite directions and ascends leaving wafers W to wafer dryer 65. Cover 71 is closed. Cover 71 is interlocked to prevent it from being unintentionally opened during rotation processing of wafers W.

Subsequently, in step S12, by the driving mechanism 77 shown in FIG. 12, wafers W are rotated at a high speed around axis center P together with fly wheels 88. Thus, remaining demineralized water scatters from the surface of wafers W, and the surfaces of wafers W are dried.

After wafers W have been dried and rotation of wafers W has been finished, wafers W are retrieved by wafer conveyor robot 67 from wafer dryer 65 in step S13. This retrieval is performed according to the process just opposite to the process of loading of the wafers.

Subsequently, in step S14, wafers W are conveyed to and above cassette loader 64 by wafer conveyor robot 67. Air cylinder 68 ascends, and wafer receptacle 69 somewhat lifts up wafers W from wafer holding rods 100. In this condition, wafer conveyor robot 67 opens arms 99 in both directions. Wafers W are left in wafer receptacle 69 of air cylinder 68. Air cylinder 68 withdraws and wafer receptacle 69 withdraws to the point below the opening of cassette table 70, so that wafers W are again loaded in cassette C.

Subsequently, in step S15, a determination is made as to whether the next cassette in which wafers to be treated are loaded exists or not. If the answer of the determination is YES, the treatment proceeds to step S2, otherwise control proceeds to step S16.

In step S16, supply of demineralized water into wafer treatment bath 1 is stopped. A series of wafer treatment processes is thus finished.

Using the system shown in FIGS. 10A-13, a series of surface treatments of wafers can be continuously performed. By changing compositions of treatment solutions supplied into wafer treatment bath 1 corresponding to various steps, plural kinds of surface treatments can be performed using this system. As in a conventional apparatus, it is not necessary to stop supply of treatment solution after surface treatment of a set of wafers and discharge all the treatment solution from the wafer treatment bath. The surface treatment can be performed rapidly. Also, by only providing a wafer cassette C on cassette table 70, a series of surface treatments can be automatically performed. The installation area for the entire system can be substantially reduced and various kinds of surface treatments can be performed with ease.

Figure 15:
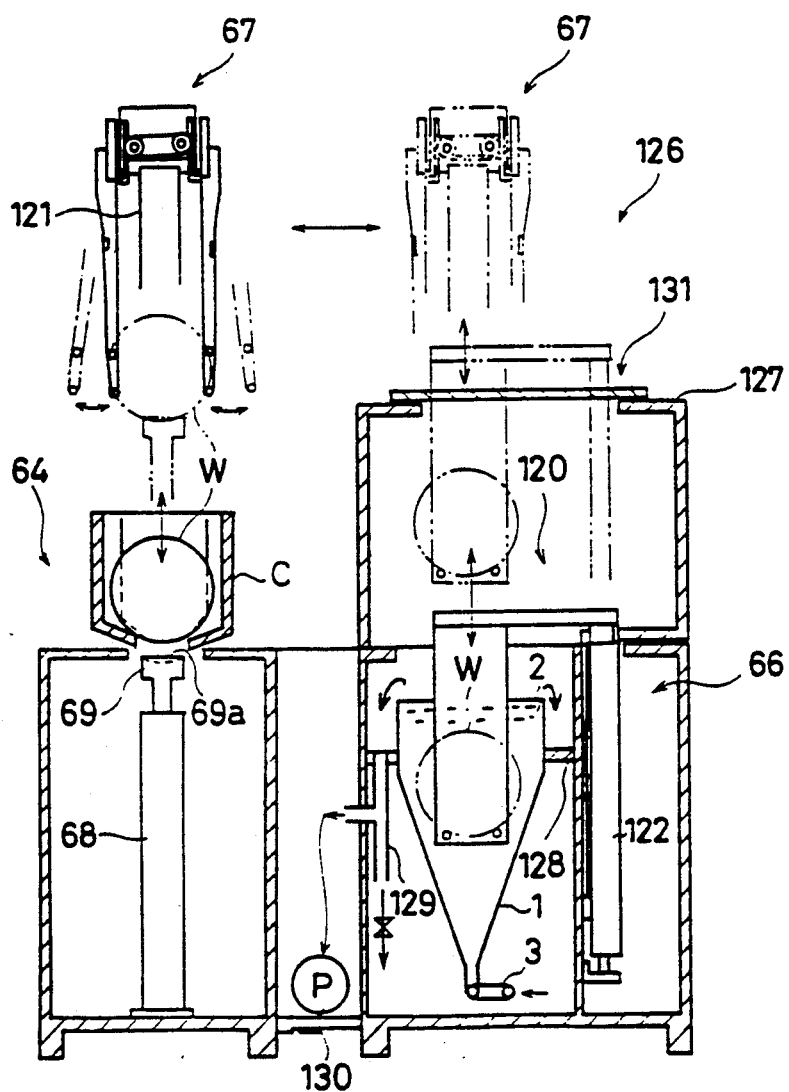
FIG. 15 is a schematic sectional view of a wafer treating system according to another embodiment of the present invention.

In FIG. 15, a cross-sectional view illustrating the schematic structure of another embodiment of a wafer treatment system according to the present invention is shown. The system shown in FIG. 15 is basically different from the system shown in FIG. 11 in that the wafer dryer 65 shown in FIG. 11 is omitted therefrom and that a wafer dryer 126 in place of the wafer dryer 65 is newly included for drying wafers W with low pressure provided on wafer treatment apparatus 66.

Described in more detail, an inner wall 128 provided around wafer treatment bath 1 and forming a drain receptacle for collecting a treatment solution flowing out of wafer treatment bath 1 and hermetically separating the housing into an upper portion and a lower portion is provided in an upper portion of housing. An exhaust/drainage pipe 129 for leading the treatment solution into drain not shown and exhausting air from the space above inner wall 128 is connected to inner wall 128. The exhaust/drainage pipe branches on the way. One of the branches leads to a drain (not shown) and the other is connected to a vacuum pump 130, for example.

Wafer dryer 126 includes a treatment chamber 127 covering an opening at an upper portion of the housing of wafer treatment apparatus 66 for hermetically separating the interior thereof from the external air. An opening through which wafer conveyor robot 67 and wafer lifting apparatus 122 passes is provided on an upper portion of treatment chamber 127. The chamber 127 is hermetically closable by a shutter 131.

The system shown in FIG. 15 is the same as the system shown in FIG. 11 in other points. The same parts are assigned with the same reference numerals and names. The functions thereof are also the same. Accordingly, detailed description thereof is not repeated here.

Figure 16:
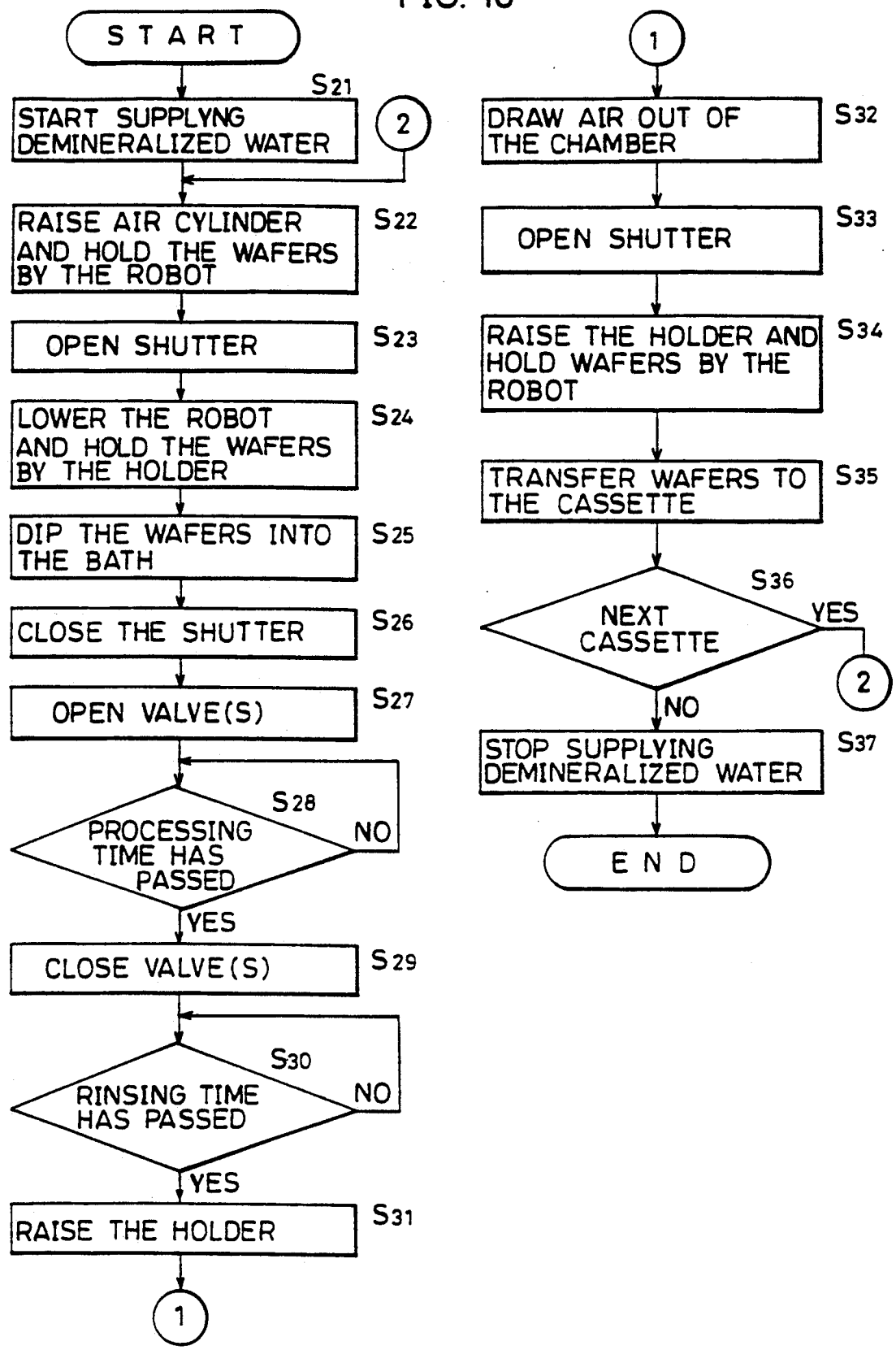
FIG. 16 is a flow chart illustrating procedure of operation of the system shown in FIG. 15.

FIG. 16 is a flow chart showing a process of wafer treatment by the apparatus shown in FIG. 15. Referring to FIGS. 15 and 16, the wafer treatment system shown in FIG. 15 operates as follows.

In step S21, supply of demineralized water into wafer treatment bath 1 is started. The demineralized water forms a uniform rising flow in wafer treatment bath 1. The wafer treatment bath overflows before long. The overflowing demineralized water is collected by inner wall 128 to exhaust/drainage pipe 129 and led to the drain.

In step S22, wafers W loaded in a cassette are transferred to wafer conveyor robot 67 by a cassette loader 64. The processing procedure at this time is the same as that already described referring to FIGS. 11 and 14. Wafer conveyor robot 67 moves in a horizontal direction and transfers wafers W to a position above wafer dryer 126.

Shutter 131 of wafer dryer 126 is opened in step S23.

Wafer conveyor robot 67 lowers wafers W to a predetermined position in step S24. Subsequently, wafer lifting apparatus 122 ascends in treatment chamber 127, and wafers W are transferred from wafer conveyor robot 67 to wafer lifting apparatus 122 according to the procedure already described referring to FIGS. 11 and 14.

In step S24, wafer lifting apparatus 122 dips wafers W into treatment solution 2 inside wafer treatment bath 1. Wafer conveyor robot 67 withdraws out of treatment chamber 127 through the opening.

In step S26, shutter 131 is closed.

In step S27, required ones of the plurality of chemical agent introducing valves in the treatment solution supplying unit (not shown) are opened depending on the composition of required treatment solution. Thus, treatment solution 2 supplied into wafer treatment bath 1 is replaced from demineralized water to a treatment solution having a desired composition.

In step S28, a waiting process is performed until a time period predetermined for treating the surfaces of wafers W passes.

In step S29, all of the chemical agent introducing valves (not shown) are closed after the predetermined time has passed. The treatment solution supplied into wafer treatment bath 1 is thus replaced from the treatment solution required for the surface treatment to demineralized water. The replacement is rapidly made as described above.

In step S30, a process of waiting is performed for the time required for rinsing the wafers W with demineralized water.

In step S31, wafer lifting apparatus 122 is elevated by a certain amount. The amount elevated at this time is determined so that the upper end of wafer lifting apparatus 122 does not touch the upper portion of treatment chamber 127 and that the wafers W are completely taken out of treatment solution 2 inside wafer treatment bath 1. It is known that most of demineralized water falls from the surface of wafer W and is removed therefrom. Furthermore, it is also known that water on the surface of wafer W is substantially completely removed by using the most appropriate values determined corresponding to the surface state of wafers W, the temperature of demineralized water, temperature and pressure inside treatment chamber 127, and the velocity of lifting wafers W. Furthermore, by drawing air inside treatment chamber 127 with vacuum pump 130, the pressure inside treatment chamber 127 is reduced and the surfaces of wafers W are dried more completely.

When the surfaces of wafers W are completely dried, shutter 131 of treatment chamber 127 is opened. (step S33).

In step S34, wafer lifting apparatus 122 further ascends. Also, wafer conveyor robot 67 descends into treatment chamber 127, and the wafers W are transferred to wafer conveyor robot 67 from wafer lifting apparatus 122 by the procedure opposite to that described above.

In step S35, wafer conveyor robot 67 conveys wafers W to and above cassette loader 64, where wafers W are loaded into cassette C according to the procedure opposite to the procedure described above.

In step S36, a determination is made as to whether another cassette in which wafers to be treated are loaded exists or not. If the answer of the determination is YES, the treatment returns to step S22, and otherwise the treatment proceeds to step S37.

In step S37, supply of demineralized water into wafer treatment bath 1 is stopped. The process of treating surfaces of wafers is finished.

It should be noted in FIG. 16 that the processings in steps S27-S29 can be repeatedly performed a required number of times corresponding to the number of steps included in the surface treatment. In FIG. 16, the repetition is omitted in order to simplify the figure.

Such a wafer treatment system as described above, as compared to such a system shown in FIG. 11, can perform more compact surface treatment of wafers. As compared to a case where a rotary type wafer dryer is used, the mechanism is more simple. Also, in the surface treatment of wafers including plural kinds of steps, the surface treatment can be continuously performed without taking out wafers out of treatment bath 1 and without bringing the wafers into contact with air. Accordingly, the surface treatment for the wafers can be rapidly performed.

In the apparatus shown in FIG. 15, vacuum pump 130 was provided for reducing pressure inside treatment chamber 127. However, it is known that, as described above, by appropriately selecting temperature of treatment solutions, temperature, pressure inside treatment chamber 127 and the velocity of lifting up wafers W, water on the surfaces of wafers W surface can be removed almost completely. Accordingly, there may be cases where a pressure reducing means such as vacuum pump 130 is not required.

Figure 17:
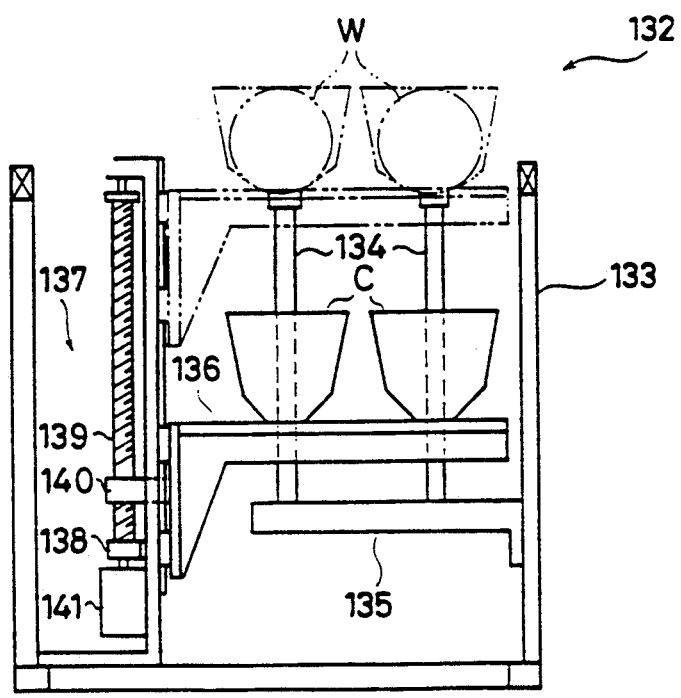
FIG. 17 is a schematic sectional view illustrating another example of a loader of a wafer.

In the two wafer treatment systems described above, air cylinder 68 for lifting wafers W upwards from cassette C standing still has been used as a mechanism for transferring wafers W from cassette C to wafer conveyor robot 67. However, the present invention is not limited to the same, and other kinds of cassette loaders may be used. FIG. 17 shows a schematic structure of another kind of cassette loader 132.

Referring to FIG. 17, the cassette loader 132 includes a housing 133, an arm 135 fixed protruding inside housing 133 below a sidewall of housing 133, two rods 134 provided fixed in a vertical direction to arm 135, a cassette table 136 upward and downward movably provided along an inner wall provided inside housing 133 on which upper portion cassette C can be provided, and a lifting mechanism 137 for lifting up and lowering down cassette table 136. As described above, at a bottom portion of cassette C, an opening is formed. An opening is also provided at a portion of cassette table 136 corresponding to the opening of cassette C placed on cassette table 136. Rod 134 can pass both of openings of cassette table 136 and cassette C.

Lifting mechanism 137 includes a motor 141 fixed at housing 133, threaded rod 139 rotatably supported at its both ends provided along an inner wall of housing 133, a pulley 138 for transmitting rotation of the rotation axis of motor 141 to the threaded rod 139, and a mating member 140 fixed to a pulley and a belt (both not shown) and cassette table 136 and having a threaded through hole which meshes with a screw portion at the periphery of threaded rod 137.

The cassette loader shown in FIG. 17 operates as follows. Cassette table 136 is first fixed at its highest position. The rotation axis of motor 141 rotates in a predetermined direction, and then the threaded rod 139 similarly rotates. The mating member 140 moves downwards by the rotation of the threaded rod 139. As cassette table 136 is fixed to mating member 140, it moves to the point below cassette table 136 together with cassette C. Wafers W loaded in cassette C remain in a cassette receptacle at the top end of rod 134 with descent of cassette C. It enables wafer conveyor robot 67 to take out wafers W from the cassette. Also, transfer of the wafers into cassette C from wafer conveyor robot 67 is performed according to the opposite process.

As described above, according to the present invention, surface treatment of wafers W can be performed rapidly with a simple mechanism. Substitution of treatment solutions is also rapidly performed. As wafers will not touch air in substituting treatment solutions, the surface treatment of wafers is well maintained. Amounts of chemical agents included in a treatment solution supplied into a wafer treatment bath are precisely controlled, so that bacteria will not appear inside a treatment solution supplying line and unnecessary chemical agents will not remain to make the treatment solutions bad, resulting in well-performed surface treatment of wafers.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A system for dipping surfaces of a plurality of wafers provided in a cassette into a treatment solution and treating the surfaces thereof, comprising:

cassette unload/load means for unloading/loading the wafers from/into the cassette;

wafer conveying means for conveying wafers unloaded from said cassette by said cassette unload/load means along a predetermined conveying path;

uniform treatment solution flow containing means, provided along said conveying path, having an inlet and an outlet for the treatment solution provided oppositely along a predetermined axis line for containing a uniform flow of said treatment solution in a direction substantially in parallel with said axis line from said inlet toward said outlet;

uniform treatment solution flow forming means for forming a uniform flow of said treatment solution inside said uniform treatment solution flow containing means by supplying said treatment solution to said uniform treatment solution flow containing means at a velocity in parallel with said axis line direction at said inlet;

water dipping/retrieving means provided along said conveying path adjacent said uniform treatment solution flow containing means for giving and receiving said wafers to and from said wafer conveying means and for dipping and retrieving the wafers into and from said uniform treatment solution flow; and wafer drying means provided along said conveying path for drying the wafers treated in said uniform treatment solution flow containing means, and including a chamber for hermetically enclosing said outlet of said uniform treatment solution flow containing means and said wafer dipping/retrieving means from outside air and having an opening through which wafers are taken into and out of said chamber between said wafer conveying means and said wafer dipping/retrieving means, with a shutter provided for hermetically closing and opening said opening from the outside air.

2. The system according to claim 1, wherein an axis line of said uniform treatment solution flow containing means is vertically directed.

3. The system according to claim 2, wherein said uniform treatment solution flow containing means comprises a hollow container having a peripheral wall having an axis line vertically directed, said peripheral wall defining said outlet at an upper portion on said axis line and said inlet at a lower portion, said peripheral wall defining the interior of said uniform treatment solution flow containing means and separating the same from the exterior, thereby allowing said treatment solution from flowing out of said uniform treatment solution flow containing means only from said outlet.

4. The system according to claim 3, wherein a distance of said peripheral wall from said axis line of said container in a horizontal plane changes as a monotone nondecreasing function of a distance between said horizontal plane and said inlet.

5. The system according to claim 4, wherein said monotone nondecreasing function is a monotone increasing function in a range in which the distance between said horizontal plane and said inlet is a predetermined value or smaller.

6. The system according to claim 5, wherein said monotone nondecreasing function is a constant function in a range where the distance between said horizontal plane and said inlet exceeds said predetermined value.

7. The system according to claim 4, wherein said figure is a point symmetrical figure having its center of symmetry on said axis line.

8. The system according to claim 7, wherein said point symmetrical figure is a rectangle.

9. The system according to claim 5, wherein said monotone increasing function is a linear function for the distance between said horizontal plane and said inlet.

10. The system according to claim 9, wherein an angle formed by said peripheral wall defined by said monotone increasing function with said axis line is 20° or smaller.

11. The system according to claim 10, wherein said peripheral wall has an upper edge defining said outlet and most part of said upper edge is on the same horizontal plane.

12. The apparatus according to claim 11, wherein all of said upper edge of said peripheral wall is on the same horizontal plane.

13. The system according to claim 1, further comprising treatment solution composition adjusting means for adjusting composition of said treatment solution provided to said uniform treatment solution flow forming means according to a predetermined value.

14. The system according to claim 13, wherein said treatment solution composition adjusting means comprises,
   treatment solution guiding means for guiding a treatment solution to said uniform treatment solution flow forming means,
   means for supplying a first solvent inactive to said wafer surface to said treatment solution guiding means,
   chemical agent introducing means for introducing a predetermined amount of chemical agent for treating said wafer surface into said first solvent guided in said treatment solution guiding means, and
   chemical agent introducing amount setting means for setting an amount of said chemical agent to be introduced in advance.

15. The system according to claim 14, wherein said chemical agent introducing means comprises,
   chemical agent containing means for containing a chemical agent,
   chemical agent guiding means communicating with said chemical agent containing means and said treatment solution guiding means for guiding said chemical agent from said chemical agent containing means to said treatment solution guiding means,
   pressurizing means provided associated with said chemical agent guiding means for pressurizing the chemical agent guided by said chemical agent guiding means,
   gate means provided at a contact portion of said chemical agent guiding moans and said treatment solution guiding means are connected to each other, said gate means being for controlling a flow of said chemical agent from said chemical agent guiding means to said treatment solution guiding means,
   supplied rate monitoring means for monitoring a rate of said chemical agent supplied by said gate means into said treatment solution guiding means, and
   supplied amount controlling means responsive to an output of said supplied rate monitoring means for controlling said pressurizing means such that the supplied rate of said chemical agent takes a predetermined value and controlling said gate means such that the supplied amount of said chemical agent takes a predetermined value.

16. The system according to claim 15,
   wherein said treatment solution guiding means on the downstream of said gate means comprises a transparent pipe, and
   said supplied rate monitoring means comprises
   light emitting means for emitting light including a predetermined wavelength which at least said chemical agent absorbs and
   light receiving means responsive to at least an incident light of said wavelength for producing an electric signal having its voltage changing depending on intensity of the incident light, said light emitting means and said light receiving means being provided on the opposite sides of said transparent pipe, and
   means responsive to an output of said light receiving means for calculating a concentration in said treatment solution of a predetermined substance having an absorption band in said predetermined wavelength.

17. The system according to claim 16, wherein
   said predetermined wavelength is approximately 2200 nm, and
   said predetermined substance is ammonia.

18. The system according to claim 16, wherein
   said predetermined wavelength is approximately 300 nm, and
   said predetermined substance is hydrogen peroxide.

19. The system according to claim 14, wherein said treatment solution composition adjusting means further comprises set amount changing means for changing the composition of said treatment solution by changing, in the course of a series of treatments, the amount of said chemical agent set by said chemical agent introducing amount setting means.

20. The system according to claim 14, wherein said first solvent is demineralized water.

21. The system according to claim 15, wherein said gate means comprises
   an outer wall defining a chemical agent introducing chamber having a first opening communicating with said treatment solution guiding means and a second opening communicating with said chemical agent guiding means and having a third opening at a portion opposing said first opening of said chemical agent introducing chamber,
   said outer wall at a portion of a periphery of said first opening forming a valve seat,
   a valve element holding rod having a valve element for sealing said first opening by being in close contact with said valve seat at a head portion thereof for opening and closing said first opening by sliding inside said second opening, and
   means controlled by said supplied amount controlling means for driving said valve element holding rod, wherein
   said head portion of said valve element is shaped so that at least a part thereof protrudes, when said first opening is sealed, into said treatment solution guiding means from a portion at which said valve seat is in contact with said valve element.

22. The system according to claim 21, wherein
   said valve element abuts against said valve seat from said chemical agent providing chamber side, and a dimension of the portion of said valve element protruding into said treatment solution guiding means from a portion in contact with said valve seat when said first opening of said outer wall is sealed is selected to be smaller than an inner diameter of said valve seat, and approximately equal to an inner dimension of said first opening but not so large as to be in contact with each other.

23. The system according to claim 21, wherein
said valve element abuts against said valve seat from said treatment solution guiding means side, and
a dimension of at least a part of a portion of said valve element protruding into said treatment solution guiding means from a portion in contact with said valve seat when said first opening is sealed is selected to be larger than the inner dimension of said valve seat.

24. The system according to claim 1, further comprising overflow drawing off means for drawing off from said apparatus said treatment solution through said outlet.

25. The system according to claim 24, further comprising,
overflow receiving means provided surrounding said outlet in said uniform treatment solution flow containing means for receiving said treatment solution flowing out of said outlet and concentrating the treatment solution to a predetermined point, and
overflow guiding means for externally guiding said concentrated treatment solution.

26. A system for dipping surfaces of a plurality of wafers provided in a cassette into a treatment solution and treating the surfaces thereof, comprising:
cassette unload/load means for unloading/loading the wafers from/into the cassette;
wafer conveying means for conveying wafers unloaded from said cassette by said cassette unload/load means along a predetermined conveying path;
uniform treatment solution flow containing means, provided along said conveying path, having an inlet and an outlet for the treatment solution provided oppositely along a predetermined axis line for containing a uniform flow of said treatment solution in a direction substantially in parallel with said axis line from said inlet toward said outlet;
uniform treatment solution flow forming means for forming a uniform flow of said treatment solution inside said uniform treatment solution flow containing means by supplying said treatment solution to said uniform treatment solution flow containing means at a velocity in parallel with said axis line direction at said inlet;
wafer dipping/retrieving means provided along said conveying path adjacent said uniform treatment solution flow containing means for giving and receiving said wafers to and from said waver conveying means and for dipping and retrieving the wafers into and from said uniform treatment solution flow;
wafer drying means provided along said conveying path for drying the wafers treated in said uniform treatment solution flow containing means, and
treatment solution composition adjusting means for adjusting a composition of said treatment solution provided to said uniform treatment solution flow forming means according to a predetermined value,
wherein said treatment solution composition adjusting means comprises
treatment solution guiding means for guiding a treatment solution to said uniform treatment solution flow forming means,
means for supplying a first solvent, nonreactive to said wafer surface, to said treatment solution guiding means,
chemical agent introducing means for introducing a predetermined amount of a chemical agent for treating said wafer surface into said first solvent guided in said treatment solution guiding means,
chemical agent introducing amount setting means for setting an amount of said chemical agent to be introduced in advance.

27. The system according to claim 26, wherein said first solvent nonreactive to said wafer surface comprises demineralized water.

* * * * *